(12) United States Patent
Cowburn et al.

(10) Patent No.: US 7,710,769 B2
(45) Date of Patent: May 4, 2010

(54) DATA STORAGE DEVICE AND METHOD

(75) Inventors: Russell Paul Cowburn, London (GB); Dorothee Petit, London (GB); Dan Read, London (GB)

(73) Assignee: Ingenia Holdings UK Limited, London (GB)

( * ) Notice: Subject to any disclaimer, the term of this patent is extended or adjusted under 35 U.S.C. 154(b) by 188 days.

(21) Appl. No.: 12/106,083

(22) Filed: Apr. 18, 2008

(65) Prior Publication Data

US 2008/0278998 A1 Nov. 13, 2008

Related U.S. Application Data

(60) Provisional application No. 60/917,005, filed on May 9, 2007.

(51) Int. Cl.
*G11C 11/14* (2006.01)
(52) U.S. Cl. .............. 365/171; 365/173; 365/158; 365/81; 365/130; 365/225.5; 438/3; 977/933
(58) Field of Classification Search ............ 365/48, 365/66, 78, 80–87, 100, 130, 148, 158, 171, 365/173, 225.5, 243.5; 216/22; 257/40, 257/421, E21.665; 438/3; 977/933–935
See application file for complete search history.

(56) References Cited

U.S. PATENT DOCUMENTS

2004/0251232 A1* 12/2004 Chen et al. ............ 216/22

2004/0252538 A1* 12/2004 Parkin .................. 365/80
2004/0252539 A1* 12/2004 Parkin .................. 365/80
2005/0078509 A1* 4/2005 Parkin .................. 365/158

(Continued)

FOREIGN PATENT DOCUMENTS

GB 609152 3/1946

(Continued)

OTHER PUBLICATIONS

Hara, Masahiro et al., Control of Domain Wall Pinning by a Switchable Magnetic Gate, Applied Physics Letters, 2006, vol. 89.

(Continued)

*Primary Examiner*—Son Dinh
*Assistant Examiner*—Harry W Byrne
(74) *Attorney, Agent, or Firm*—McDonnell Boehnen Hulbert & Berghoff LLP

(57) ABSTRACT

A serial magnetic mass storage device and associated data storage method is provided based on magnetic nanowires that support single magnetic domains separated by domain walls. Each data-storing nanowire has a plurality of crossing nanowires along its length, forming cross junctions that constitute domain wall pinning sites. Data is fed through each data-storing nanowire by moving the magnetic domains under the action of a field that alternates between alignment and anti-alignment with the crossing nanowires. The data is encoded in the chirality of the domain walls, with up and down chirality transverse domain walls being used to encode 0's and 1's. Data is clocked into each nanowire with suitable nucleation generators capable of nucleating domains with domain walls of pre-defined chirality. Data is clocked out of each nanowire with suitable magnetic field sensors that sense the chirality.

18 Claims, 19 Drawing Sheets

U.S. PATENT DOCUMENTS

| | | | |
|---|---|---|---|
| 2005/0078511 A1* | 4/2005 | Parkin | 365/171 |
| 2005/0094427 A1* | 5/2005 | Parkin | 365/80 |
| 2005/0186686 A1* | 8/2005 | Chen et al. | 438/3 |
| 2006/0120132 A1* | 6/2006 | Parkin | 365/80 |

FOREIGN PATENT DOCUMENTS

| | | |
|---|---|---|
| GB | 1435074 | 5/1976 |
| GB | 1507566 | 4/1978 |
| GB | 2438003 A | 11/2007 |
| WO | WO 2004/077451 A1 | 9/2004 |

OTHER PUBLICATIONS

Hirohata, A. et al., Magnetic Domain Studies of Permalloy Wire-Based Structures with Junctions, IEEE Transactions on Magnetics, Sep. 2000, pp. 3068-3070, vol. 36, No. 5.

Zhu, Xiaobin et al., Spatially Resolved Observation of Domain-Wall Propagation in a Submicron Ferromagnetic NOT-gate, Applied Physics Letters, 2005, vol. 87.

Cowburn, R.P., et al., Domain Wall Injection and Propagation in Planar Permalloy Nanowires, Journal of Applied Physics, May 15, 2002, pp. 6949-6951, vol. 91, No. 10.

Faulkner, Colm C., et al., Artificial Domain Wall Nanotraps in Ni81Fe19 Wires, Journal of Applied Physics, Jun. 1, 2004, pp. 6717-6719, vol. 95, No. 11.

Allwood, D.A., et al., Magnetic Domain-Wall Logic, Science, Sep. 9, 2005, pp. 1688-1692, vol. 309.

Allwood, D.A., et al. Magneto-optical Kerr Effect Analysis of Magnetic Nanostructures, Journal of Physics D: Applied Physics, Sep. 3, 2003, pp. 2175-2182, Institute of Physics Publishing Ltd., United Kingdom.

Klaui, M., et al., Domain Wall Pinning in Narrow Ferromagnetic Ring Structures Probed by Magnetoresistance Measurements, Physical Review Letters, Mar. 7, 2003, pp. 097202-1-097202-4, vol. 90, No. 9.

McMichael, R.D., et al., Head to Head Domain Wall Structures in Thin Magnetic Strips, IEEE Transactions on Magnetics, Sep. 1997, pp. 4167-4169, vol. 33, No. 5.

Porter, D.G., et al., Velocity of Transverse Domain Wall Motion Along Thin, Narrow Strips, Journal of Applied Physics, Jun. 1, 2004, pp. 6729-6731, vol. 95, No. 11.

International Search Report and Written Opinion dated Jun. 30, 2008.

* cited by examiner

SUCK

SPIT

SUCK

SPIT

SUCK

SPIT

SUCK

SPIT

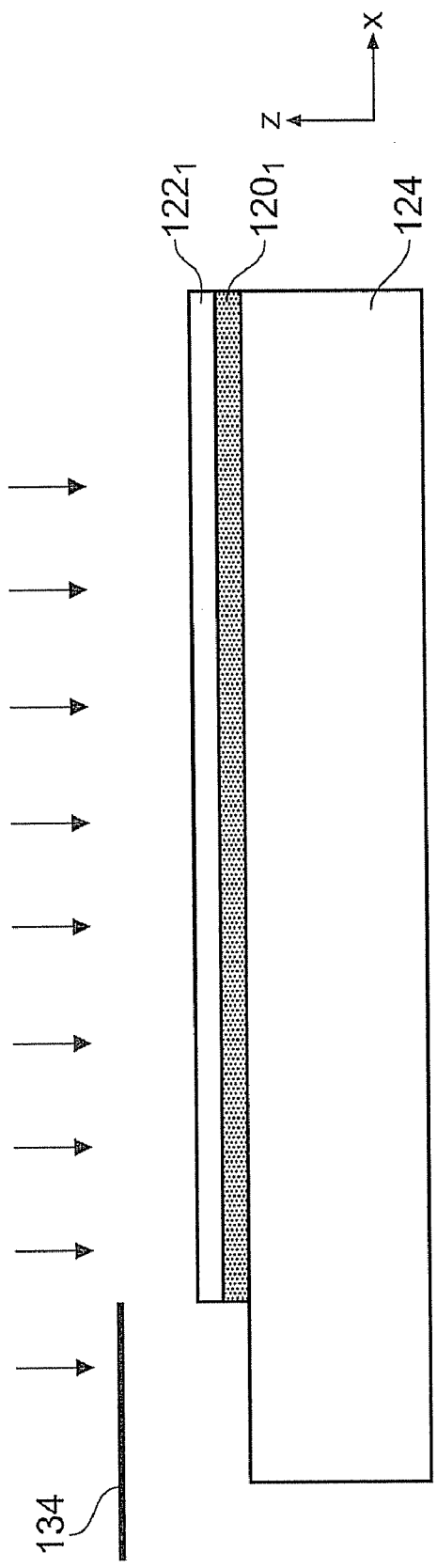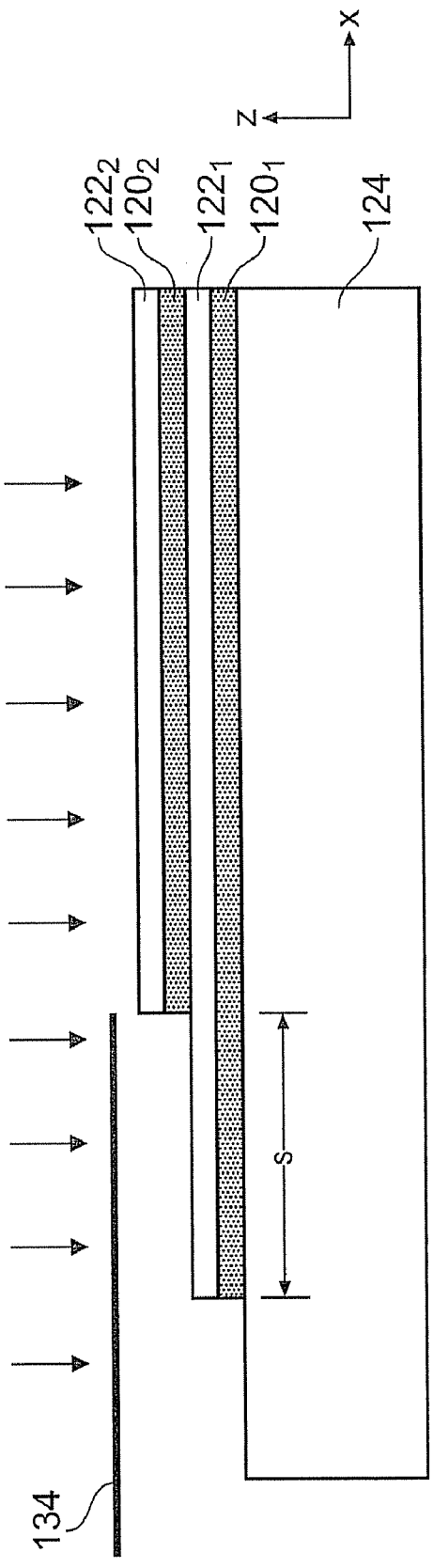

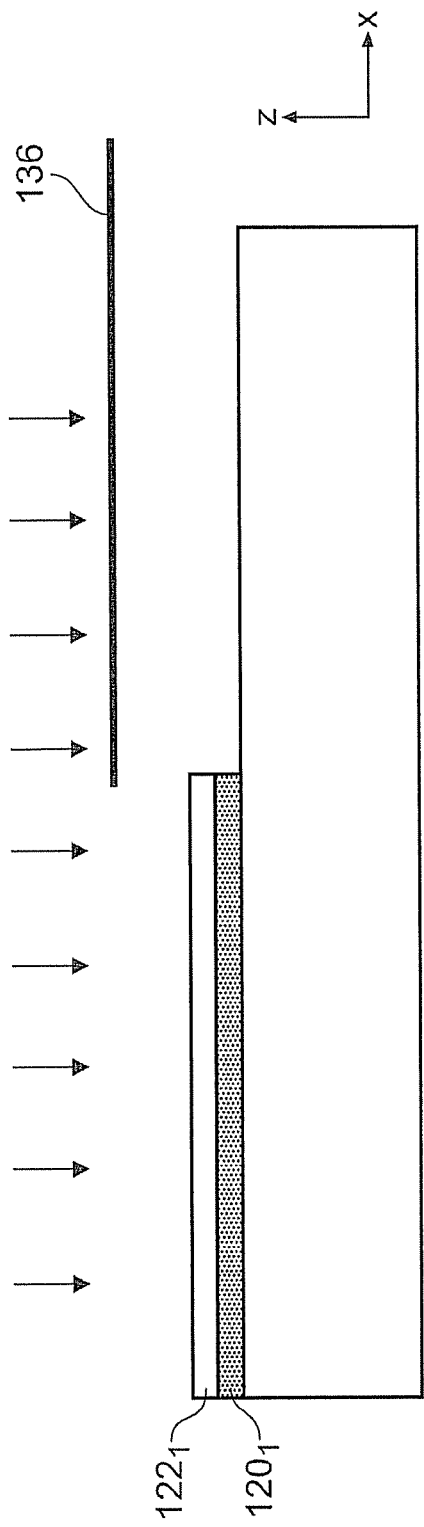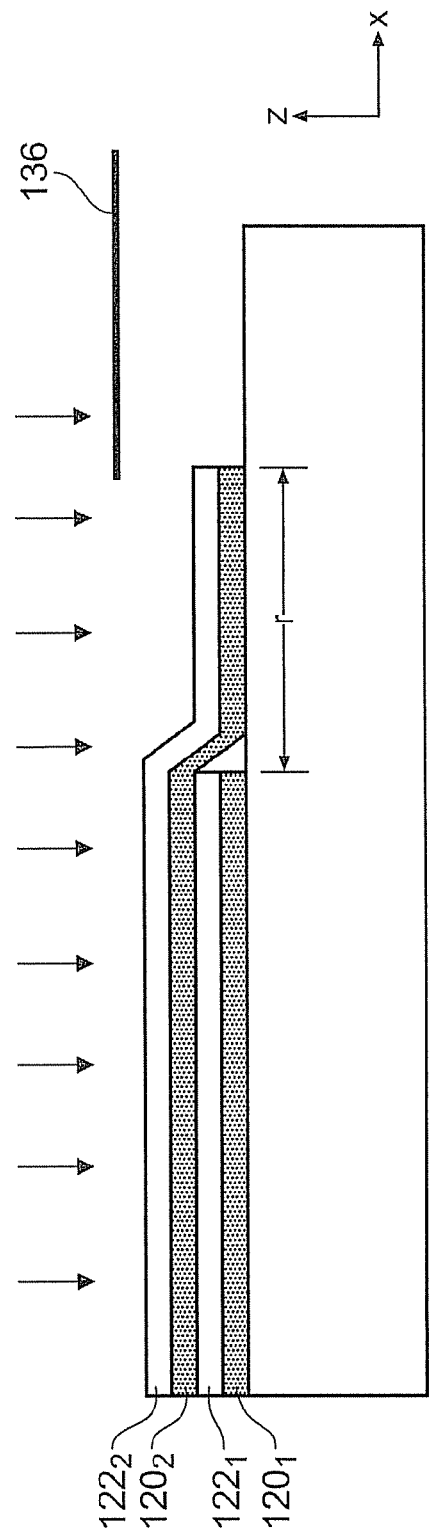

DATA STORAGE DEVICE AND METHOD

FIELD OF THE INVENTION

The present invention relates to data storage, more especially but not exclusively to mass storage memory devices capable of storing GBytes of data, and of storing data at high densities.

Hard drives with magnetic disks are the dominant technology for mass data storage and retrieval in personal computers (PCs). With current technology hard disk drives have storage capacities of up to around 100-200 GBytes, although smaller capacity miniature units are used in some devices, such as portable music players, video players and other portably multimedia devices which typically have drive capacities in the range 30-40 GBytes, or even smaller devices for digital cameras of sub-10 GBytes. The basic structure of a hard drive can trace its heritage back to a 19th century gramophone, in that it is fundamentally a mechanical device based on a spinning disk with a pivotally mounted arm that can be positioned over the disk to read (and write) data stored on the disk in generally circular tracks. Optical storage devices, such as CD and DVD read/write devices, adopt a similar construction at a basic level in that a spinning disk (whose storage mechanism may be based on a variety of physical mechanisms) is accessed optically using a head that emits a laser beam downwardly onto the disk.

There is general recognition that it would be desirable to dispense with hard drives and other spinning-disk based devices in that they are the last truly mechanical components in a personal computer and other devices that have multi-GByte mass storage requirements. Spinning disk systems suffer from unreliability of the mechanical components (such as the disk bearings), cannot be miniaturized well, and cannot be used in high vibration or high shock environments. All require an ultra-flat disk surface to which the head has access to the surface. Any contamination of the surface through dust particles or other foreign bodies or warping or other non-flatness of the surface can result in failure to read/write or catastrophic failure of the device by crashing of the head. Moreover, access times are of a mechanical time scale and in a PC severely limit the microprocessor's performance. It is estimated that in a PC up to one third of the instruction cycles of a microprocessor can be wasted by waiting for the hard disk.

Non-volatile serial memory based on semiconductor integrated circuits continues to develop strongly in terms of reduced cost and increased capacity. (Serial memory that stores data serially, i.e. filewise, and is thus suitable for file storage, is to be contrasted with Random Access Memory (RAM) which stores data individually, i.e. bitwise, and is thus suitable to high speed access of small data segments, such as for processing operations.) Serial semiconductor memory is typically some form of EEPROM (Electrically Erasable Programmable Read-Only Memory). Flash memory is the non-volatile semiconductor memory of choice, being used widely in devices such as USB memory sticks, CF/SD memory cards for digital cameras, mobile phones and MP3 players. However, with current technology semiconductor memory is still too costly to displace hard drives. Moreover, such memories suffer from problems associated with limited write endurance and write latency. In particular, flash memory has a life cycle of up to approximately 1000 write operations before degradation of reliability and performance occurs. Also, the write latency for flash memory is high due to the need to charge a large capacitance for the data storage. Additionally, flash memory has a storage density limit of approximately 40 Mbit/$mm^2$ (approximately 25 Gbit/$in^2$).

By way of concrete example, today's flash chips store data at an areal density of around 15 Gbits/square inch. ULSI chips cost about $100 per square inch to manufacture, so the cost per bit of flash memory is about 1 micro-cent. In comparison, today's hard drives cost about $100 to manufacture and this does not change much with the storage capacity, so a large PC disk drive, a smaller laptop disk drive or a small form-factor drive for a digital camera all cost roughly the same. For a PC disk drive of 100 GBytes, the cost per bit is thus 0.01 microcents, i.e. about 100 times cheaper than flash memory. On the other hand, a miniature disk drive for a camera of say 2 GBytes will have a cost per bit of about 1 microcent, i.e. the same as flash memory. The commercial trade-off between flash memory and hard drives is most obvious in the MP3 player market where smaller capacity players are based on flash memory and larger capacity players are based on hard drives.

As well as cost per bit, another key parameter for mass data storage devices is density of information. Both disk drives and flash memory have important limitations in the density of information that they can store by today's state-of-the-art lithography. In the case of flash memory, lithography defines the basic storage cell; a typical cell is roughly $10F^2$ in area, where F is the minimum feature size that can be produced by the generation of lithography in use (90 nm today, soon 65 nm). In the case of a hard disk drive, lithography is used to define the gap in the write head which defines how well focused the writing magnetic field is, and hence the smallest bit size that can be written. Storage densities of both of these technologies will thus be unable to make order of magnitude leaps without a sudden (and unexpected) change in lithography performance.

A step-increase in data storage densities is highly desirable for several reasons.

Firstly, consumers and computer applications can always use more memory. Secondly, as mobile devices such as PDAs (personal digital assistants) and mobile phones become for advanced (e.g. 3G video streaming etc) there is a need to give the volumes of file storage space usually associated with laptops and desktop computers to very small devices. This miniaturization can only be achieved with very high density memory. Thirdly, the only reason that the hard disk persists is that the cost per bit of stored data is 100 times lower than the semiconductor equivalent (e.g. flash or battery-backed DRAM). To give a computer 100 GB of file storage (a typical hard disk capacity) using flash memory would cost around $10,000 at today's prices. Because lithography can't be improved by a factor of 10-100 in the short term, a different solution for increasing storage density is required.

Our view is that the only way to increase storage density by orders of magnitude with current lithography is to move away from 2-dimensional devices to 3-dimensional devices. This allows the total amount of information stored to be increased without reducing the minimum feature size of the lithography. However, the only approach to 3-dimensional solid state memory available at the moment is simply to layer devices on top of each other, each layer requiring electrical connection. The number of process steps in the manufacturing route therefore increases with the number of layers, and since the manufacturing cost is determined partly by the number of process steps, the actual cost per bit would not fall.

What is needed is a way of remotely reading and writing bits from a 3-dimensional (3D) volume of data storage so that electrical connections (and hence process steps) do not have to be made for each part of the volume.

Magneto-electric devices have the potential to fulfill this requirement, since they are (i) non-volatile and (ii) can be acted upon by magnetic fields, which can be created and sensed at a distance. Magneto-electric devices for data storage that have been proposed can broadly be classified into two classes: single domain devices and domain wall devices. Single domain devices, such as magnetic RAM cells, attempt to keep all of the spins within a device element tightly locked together. Domain wall devices use manipulation of the location of the domain wall itself to signify different data states.

One kind of 3D magnetic memory device has been developed by Parkin and Chen at International Business Machines Corporation (IBM) [1-6]. This magnetic memory device is based on ferromagnetic nanowires which are referred to by this group as data tracks or race tracks. Specifically, it uses domain walls in the nanowires to encode data serially in a plurality of alternately directed single domains along the nanowires. The device uses spin-based electronics to write and read data. An electric current is applied to the nanowires to move the magnetic domains along the track in the direction of the electric current, past reading or writing elements. The electric current passed across the domain wall acts to move the domain walls in the direction of the current flow. As the current passes through a domain, it becomes "spin polarized". When this spin-polarized current passes into the next domain across a domain wall, it develops a spin torque. This spin torque moves the domain wall. The key breakthrough of this design is that the spin polarization effect allows both head-to-head and tail-to-tail domain walls to be moved in the same direction along the nanowire to shift the data encoded by the domains along the nanowire in a kind of pipeline. However, as well as being a breakthrough, using this spin-polarization effect is at the same time a serious limitation for any device based on this principle. This is because the current-induced propagation along the nanowire of the head-to-head and tail-to-tail domain walls needs to be under complete control, since if adjacent head-to-head and tail-to-tail domain walls do not propagate at near equal speed, they will come together and annihilate, thereby corrupting the data encoded by the domains. For example, any inhomogeneity along the nanowires may affect the propagation speed of the domain walls leading to differential motion between adjacent domain walls. To achieve the necessary control of the propagation speed in such devices will become increasingly challenging from a fabrication point of view as such devices is scaled up from a prototype stage to a production device. Consequently, in our view at least, it is by no means certain that this type of device can successfully be developed into a commercial product.

Recent research on domain wall devices from our group and others is now discussed in more detail. The nucleation and propagation properties of domain walls in nanoscale wires have been studied [7-11]. In particular it has been shown that nanostructures can be made in which the (threshold) domain wall nucleation field is significantly higher than the (threshold) domain wall propagation field. With this approach nanowires can be fabricated with a nucleation field of about 200 Oersted (Oe) and a propagation field of only about 3 Oe. This means that that domain walls can be propagated within the nanostructures using appropriate drive fields having a magnitude between the propagation field and the nucleation field without causing additional domain walls to be nucleated. Moreover, new domain walls can be selectively nucleated in a controlled manner in localized parts of the nanostructure by applying a local field having a magnitude greater than the nucleation field. Consequently, nanostructures have been demonstrated in which domain walls are nucleated (i.e. created), moved and annihilated in a controlled, stable and reproducible manner. The presence (or absence) of domain walls can be sensed at localized parts of the nanostructure using a suitable sensor, such as a magneto-optical Kerr effect (MOKE) device [11] or an anisotropic magneto resistance (AMR) device [12].

We have demonstrated how domain walls can be exploited to fabricate a data storage device [8, 10] in which a logical NOT gate function can be achieved by providing a nanowire section that follows a cycloid path. By repeating these cycloids along a nanowire, a data storage pipe can be fabricated that operates as a serial memory device. We have also shown that a domain wall can propagate freely through a first nanowire that is crossed by a second nanowire so that nanowires in a common plane of a magnetic logic circuit can be crossed without interacting with each other [10].

We have further shown [8, 9, 10] that the position of a domain wall in a nanowire can be controlled using traps which serve to pin the domain wall. Namely, we have demonstrated that traps can be provided by nanowire corners [9, 10] and inward or outward notches in the nanowires [9], wherein inward and outward notches are domain wall pinning site created by a local narrowing and widening of a nanowire respectively.

These traps provide a localized increase in the threshold propagation field. By applying a field greater than the propagation field for the nanowire and less than the local propagation field for the trap, a domain wall can be moved along the wire and into the trap where it will remain pinned. The domain wall can then be depinned and moved along the wire again by increasing the field beyond the local propagation field for the trap.

A further example of domain wall traps in nanowires is known from Hara and co-workers [15]. In this work, a magnetic NiFe-alloy nanowire is abutted on either side by a pair of ferromagnetic wires of the same width as the nanowire, these being referred to as "gate" wires in the article. The gate wires are constricted to one third of their width at the junction with the nanowire so that the domain in each gate wire stays pinned at the nanowire junction. Hara et al also note that the domain walls in their nanowires are of the vortex type, i.e. not transverse, owing to the dimensions of the nanowires used (see reference [14] for an explanation of vortex and transverse domain wall types).

FIGS. 1A to 1D of the accompanying drawings illustrate such a junction, more specifically four possible states of such a junction, these being provided by the four permutations of up and down domain alignment in the first and second gate wires. Referring to FIG. 1A, there is shown in plan view a nanowire 10 of width w which at an intermediate position along its extent has first and second gate wires 20 and 21, also of width w, abutting its sides which serve to pin a domain wall 16 of the nanowire 10 which separates magnetic domains 114 that are illustrated with arrows indicating the magnetic moment in the conventional way. The gate wires 20 and 21 each have constrictions at their junction with the nanowire 10. The magnetostatic charge accumulations associated with the different domain walls are illustrated by the encircled plus and minus symbols for positive and negative charge. FIGS. 1B to 1D are similar illustrations, each with different permutations of alignments of the domains in the two gate wires. The domains in the nanowire 10 are the same in all cases showing a head-to-head domain wall pinned at the junction of the gate wires.

FIGS. 1A to 1D illustrate the cases labeled A to D respectively by Hara et al. The drawings also show the example of a head-to-head domain wall at the cross, which is what was modeled by Hara et al. (The other alternative would be a tail-to-tail domain wall.) In their experiments, the expected pinning effect of the nanowire's domain walls at the gate is observed. More interestingly, Hara et al showed that the trapping or pinning field of domains in the nanowire at the gate depended strongly on whether the domains in the two gate wire sections either side of the nanowire were parallel to each other (cases A and C) or anti-parallel (cases B and D). In cases B and D where the domains in the gate wires were anti-parallel a large pinning field was observed, which was about twice the nucleation field. In cases A and C where the domains in the gate wires were parallel a lower pinning field was observed, which was comparable to or lower than the nucleation field.

Although not stated in the article by Hara et al, the experimental observation is logical given the fact that the respective magnetostatic charge accumulations associated with the two gate wire domains terminating at either side of the nanowire will be of the same charge for the anti-parallel cases B and D and different charge for the parallel cases A and C. The anti-parallel cases will thus provide a junction that displays a greater repulsion from or attraction to a domain wall in the nanowire than the parallel cases where the magnetostatic charge accumulations effectively cancel out.

In further work, not yet published [16], we have shown how nanowires with notch pinning sites along their length can be used as non-volatile serial memory devices operable at room temperature in which data is encoded in the magnetic domains. Data is read into the nanowire serially, by nucleating domains at one end of the nanowire and then moving the domains along the nanowire under the action of an operating field and synchronized electrode drive signal. The magnetic domains defined are used to encode data. Data is read out of the opposite end of the nanowire by a suitable magnetic sensor, such as a tunnel junction, spin valve or a Hall effect sensor.

FIG. 2 of the accompanying drawings schematically shows such a nanowire 10 comprising notches 12 and supporting magnetic domains 14 separated by head-to-head and tail-to-tail domain walls 16 and 18 respectively [16]. An operating field H that alternates between being aligned and anti-aligned with the direction of extent of the nanowire (+y and −y in the figure) is driven in synchrony with a drive current that is passed through selected ones of the electrodes 12 that extend orthogonal to the nanowire (z direction in the figure) to alternately heat notches 12 hosting head-to-head and tail-to-tail domain walls in synchrony with the alignment and anti-alignment of the operating field. The heating is provided by Joule heating from the electrodes that are arranged adjacent to the notches. The effect of the heating is to temporarily lower the locally enhanced propagation field at the heated notch to below the operating field. The separate actuation of head-to-head and tail-to-tail domain walls is achieved by using three groups of heating electrodes, labeled A, B and C, attached in repeated series to directly adjacent notches. Between clocking cycles, this arrangement means that all the head-to-head domain walls are hosted by notches addressed by one of the electrode groups, all the tail-to-tail domain walls are hosted by notches addressed by another one of the electrode groups, and the notches addressed by the remaining electrode group are "empty", i.e. do not host any domain walls. The magnetic domains can thus be moved along the nanowire by alternate movement of the head-to-head and tail-to-tail domain walls.

A feature of our previously proposed serial memory device is that the heating electrodes need to be arranged close to the nanowire notches, so fabrication of the electrodes becomes an important part of the manufacturing process.

Another feature of our previously proposed serial memory device is that the desired unidirectional domain propagation is only possible if the data coding scheme is chosen such that the device controller always knows which sign (head-to-head or tail-to-tail) domain wall is present at a given group of notches (A, B or C), although the controller does not have to know whether a domain wall is present or not. This requirement places a limitation on the maximum density of information that can be coded. Specifically, it means that three adjacent notches must be used for every single bit of information and that two domain walls must be used to code each bit. For example, one encoding scheme is that a 1 is coded by a head-to-head domain wall followed by a tail-to-tail domain wall spread across 3 notches, while a 0 is coded by the absence of any domain walls across the same length. The data density per unit length of nanowire (in terms of numbers of notches) is thus limited by the encoding scheme.

The aim of the invention is to provide a non-volatile serial memory device based on manipulation of magnetic domains in nanowires with a simplified addressing scheme to that previously proposed in our unpublished work and a higher data density [16].

SUMMARY OF THE INVENTION

According to the invention there is provided a method of manipulating a domain wall in a first nanowire crossed by a second nanowire to form a junction, comprising: attracting a domain wall into the junction by aligning a magnetic domain in the second nanowire where it crosses the first nanowire with the domain wall in the first nanowire so that the domain wall becomes pinned at the junction; and repelling the domain wall from the junction by reversing the alignment of the magnetic domain in the second nanowire so that it becomes anti-aligned with the domain wall in the first nanowire and ejects it from the junction.

Successive domain reversals in the second nanowire thus cause domain walls in the first nanowire to be moved through the junction by a two-step sucking and spitting action. This is true for all domain wall types, namely for head-to-head or tail-to-tail domain walls, and for domain walls of different chirality. This is an important result, since the suck-and-spit action moves both head-to-head and tail-to-tail domain walls together. The fact that head-to-head and tail-to-tail domain walls are associated with opposite charge accumulations is not relevant to this process. It is thus possible with an externally applied alternating magnetic field to move a domain wall through the junction. In practical applications, a device can be provided with any number of such junctions, which can all be clocked simultaneously with a single globally applied external field.

According to the invention there is thus provided a magnetic memory device for serially storing data encoded in magnetic domains pinned at a succession of pinning sites spaced apart along a nanowire, wherein each pinning site is formed by a junction between the nanowire and another nanowire crossing it.

According to a further aspect of the invention there is provided a magnetic memory device in which data is encoded in the chirality of the domain walls that separate magnetic domains in a nanowire.

According to a still further aspect of the invention there is provided a magnetic memory device comprising: a plurality of data-carrying nanowires made of magnetic material and extending in a first direction crossed by a plurality of data-clocking nanowires also made of magnetic material and extending in a second direction, collectively forming a network of cross junctions; a data read-in part arranged adjacent to respective data read-in portions of the data-carrying nanowires and operable to nucleate magnetic domains with domain walls of pre-determined chirality in the data-carrying nanowires, wherein the chirality of the domain walls encodes the data to be stored; a magnetic field source operable to generate a clocking field that alternates between alignment and anti-alignment with the data-clocking nanowires, which serves to move the data-carrying domain walls along the data-carrying nanowires from one cross junction to the next by successively releasing the data-carrying domain walls from the cross junctions where they are pinned and causing them to move to said next cross junction where they are pinned again; and a data read-out part arranged adjacent to respective data read-out portions of the data-carrying nanowires and operable to sense the chirality of the domain walls in said data read-out portions.

The above approach has several advantages. First, data can be clocked through the device with a global externally applied field, i.e. the clocking field. No addressing of individual pinning sites, i.e. nanowire crosses, or groups of pinning sites is needed. This is because the novel clocking mechanism provided by the combination of nanowire crosses and clocking field is not sensitive to the charge state of the domain wall, i.e. whether the domain wall is a head-to-head domain wall or a tail-to-tail domain wall. The same field can thus be applied to all pinning sites to move the data incrementally through the nanowire pinning sites. Second, the structure is readily scalable in three dimensions in that multiple layers of nanowire networks can be arranged on top of each other, thus providing a very high storage density. This scalability in the vertical dimension is simplified by the fact that data can be clocked through the device with a global externally applied field. Third, the novel approach of encoding the data in the chirality of the domain walls allows for relatively dense data storage in comparison with previously proposed magnetic nanowire serial memories which use properties of the domains themselves, such as domain length, to encode the data.

A further magnetic field source may be provided which is operable to generate an operating field aligned with the data-carrying nanowires, which serves to assist movement of the data-carrying domain walls along the data-carrying nanowires between cross junctions.

The data read-in part preferably comprises a plurality of nucleation field generators, one for each data-carrying nanowire, each arranged to selectively create the magnetic domains of pre-defined chirality by locally applying a field of at least the nucleation field in the data-carrying nanowire at the read-in portion.

The data read-out part preferably comprises a plurality of magnetic field detectors, one for each data-carrying nanowire, each arranged to sense the chirality of the domain walls in the data-carrying nanowire at the data read-out portion.

In the main embodiments, the data-carrying nanowires are dimensioned so that domain walls that form therein are transverse domain walls, the chirality of the domain walls that encode the data thus being up or down.

It may also be possible to make a functioning device in which the data-carrying nanowires are dimensioned so that domain walls that form therein are vortex domain walls. However, this option has not been experimentally tested, and the pinning properties of the cross junctions for vortex domain walls may or may not be suitable for application of the invention.

In the main embodiments, the data-clocking nanowires are dimensioned so that domain walls that form therein are transverse domain walls.

It may also be possible to make a functioning device in which the data-clocking nanowires are dimensioned so that domain walls that form therein are vortex domain walls. However, this option has not been experimentally tested, and vortex domain walls may or may not provide the necessary attractive and repulsive properties for domain walls pinned at the cross junctions.

The device preferably further comprises a clocking domain generation part arranged adjacent to respective clocking portions of the data-clocking nanowires and operable to nucleate magnetic domains in the data-clocking nanowires. If required, the clocking domain generation part can be made so it is operable to nucleate domain walls of pre-determined chirality. The clocking domain generation part may comprise a plurality of further nucleation field generators, one for each data-clocking nanowire, each arranged to selectively create the magnetic domains by locally applying a field of at least the nucleation field in the data-clocking nanowire at the clocking portion.

The device will typically be fabricated on a substrate and the network of cross junctions will be arranged on the substrate as a magnetic layer formed of magnetic material for the nanowires interspersed with islands of non-magnetic material to separate them. The nanowire structure may be fabricated as a layer in a conventional lithography process.

The device may be fabricated as a multi-layer, three-dimensional memory. Namely, multiple magnetic layers can be arranged on top of one another, each separated by a non-magnetic layer. The device will thus have a plurality of crossed nanowire planes extending in the vertical direction.

The pairs of magnetic and non-magnetic layers may terminate in a stepwise manner on one side of the data-carrying nanowires to form terraces extending in the direction of the data-clocking nanowires. The magnetic layer that terminates to form each terrace may in each case either be the lowermost nanowire layer or the uppermost nanowire layer. If the pairs of magnetic and non-magnetic layers terminate in a stepwise manner on both sides of the data-carrying nanowires, the magnetic layer that terminates to form each terrace is preferably the lowermost nanowire layer on one side and the uppermost nanowire layer on the other side, since this structure lends itself to fabrication using a stepped shadow mask process.

According to a further aspect of the invention there is provided a method of serially storing data encoded in magnetic domains in a nanowire, wherein the chirality of the domain walls is used to encode the data.

According to a further aspect of the invention there is provided a method of serially storing data encoded in magnetic domains pinned at a succession of pinning sites spaced apart along a nanowire, wherein each pinning site is formed by a junction between the nanowire and another nanowire crossing it.

According to a further aspect of the invention there is provided a method of serially storing data encoded in magnetic domains in a nanowire, each magnetic domain being bounded by a domain wall, and the nanowire having a plurality of crossing nanowires along its length forming a plurality of cross junctions along the nanowire, the method comprising: reading a stream of bits of data into the nanowire by nucleating respective magnetic domains with domain walls of pre-determined chirality at an input portion of the nanowire, wherein the chirality of the domain walls encodes the bits; supplying a clocking field that alternates between alignment and anti-alignment with the crossing nanowires to move the domain walls, and thus the bit stream, along the nanowire from one cross junction to the next by successively releasing the domain walls from the cross junctions where they are pinned and causing them to move to said next cross junction where they are pinned again; and reading the bit stream out of the nanowire by sensing the chirality of the domain walls at an output portion of the nanowire.

Particular and preferred aspects and embodiments are also set out in the appended claims.

DEFINITIONS

Domain wall: an interface between magnetic domains of oppositely aligned magnetization.

Transverse domain wall: a domain wall in which the magnetization is predominantly aligned in a single direction in the plane of the domain wall. In a typical magnetic nanowire which is much wider than it is thick, the magnetization alignment will be in one of two states aligned or anti-aligned with the long dimension of the cross-section [13]. These two states are referred to as states of 'up' and 'down' chirality, or 'left' and 'right' chirality, with reference to the principal magnetization direction. Transverse domain walls will tend to form in smaller cross-section nanowires [13].

Vortex domain wall: a domain wall in which the magnetization forms a vortex or spiral pattern at the domain wall. Vortex domain walls will have a clockwise or counter-clockwise orientation of their magnetization patterns in plan view, these two states being referred to as clockwise or counter-clockwise chirality [13]. Vortex domain walls will tend to form in larger cross-section nanowires [13].

Head-to-head domain wall: a domain wall between "north" ends or heads of adjacent magnetic domains generally associated with a positive magnetostatic charge accumulation.

Tail-to-tail domain wall: a domain wall between "south" ends or tails of adjacent magnetic domains generally associated with a negative magnetostatic charge accumulation.

Nanowire: a domain wall conduit made of magnetic material having sufficient shape anisotropy that magnetization aligns with the longitudinal axis of the nanowire. Typically made of soft magnetic material such as Permalloy ($Ni_{80}Fe_{20}$).

Domain nucleation field: a threshold field, being the minimum field that need be applied to reverse magnetization in a nanowire if no reverse domain already exists in the wire.

Domain propagation field: a threshold field, being the minimum field that need be applied to move a domain wall along a nanowire.

Domain wall pinning site: a location along a nanowire at which the nanowire has a locally enhanced propagation field caused by a pre-fabricated (i.e. not naturally occurring) modulation of the energy of a domain wall present at that location.

Depinning field: the locally enhanced domain propagation field needed to render domain walls mobile across (and out of) pinning sites.

Operating field: a field having a strength between the propagation field and the depinning field.

Depinning energy: the energy that needs to be applied to a pinning site to temporarily lower the locally enhanced propagation field to below the operating field.

It will be understood that references to "field", such as operating field and so forth, in most cases mean a magnetic field having a substantial component in the plane of the nanowires for manipulating domain walls.

BRIEF DESCRIPTION OF THE FIGURES

Specific embodiments of the present invention will now be described by way of example only with reference to the accompanying figures in which:

FIGS. 15A and 15B are schematic side section views in the xz plane showing fabrication of an input side of the multi-layer memory device;

FIGS. 16A and 16B are schematic side section views in the xz plane showing fabrication of an output side of the multi-layer memory device;

Figure 1A:
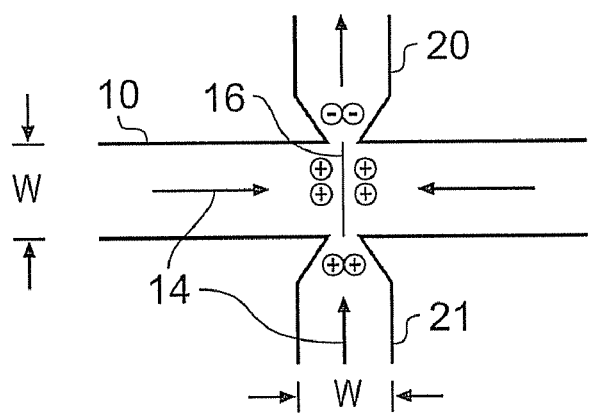
FIGS. 1A to 1D are schematic plan view representations of nanowire structures according to the prior art.
Figure 1B:
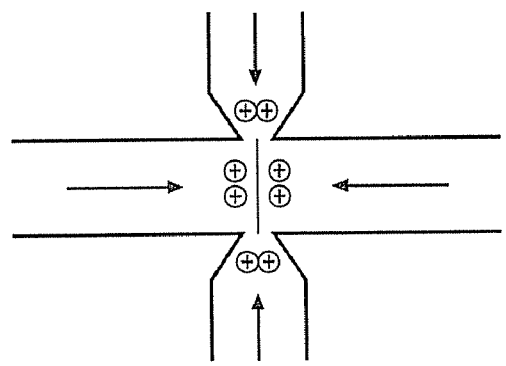
Figure 1C:
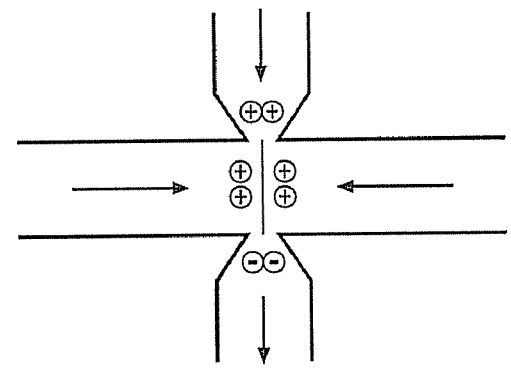
Figure 1D:
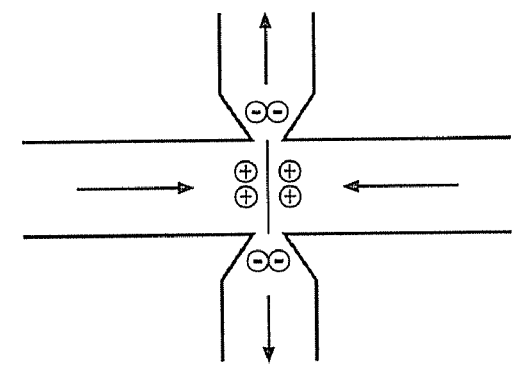
Figure 2:
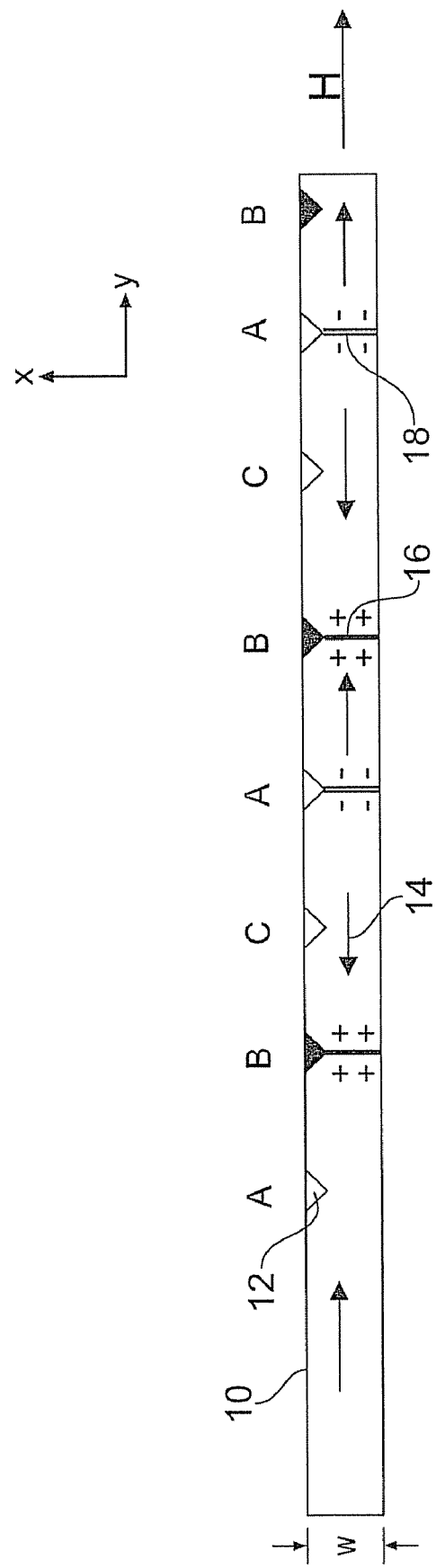
FIG. 2 is a schematic plan view representation of a nanowire according to a previously proposed device.

While the invention is susceptible to various modifications and alternative forms, specific embodiments are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the spirit and scope of the present invention as defined by the appended claims.

DESCRIPTION OF PARTICULAR EMBODIMENTS

Figure 3A:
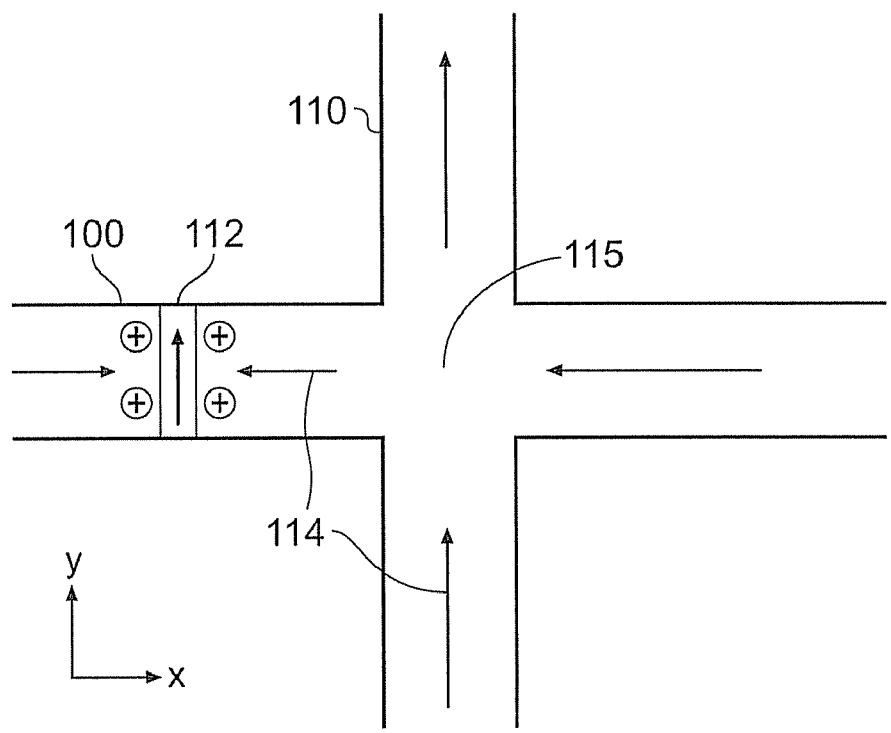
FIG. 3A is a schematic plan view representation of a nanowire structure embodying to the invention to illustrate a first basic state exploited by devices according to the invention.

FIG. 3A is a schematic plan view representation of a magnetic nanowire structure embodying to the invention. The following convention is adopted throughout for the axes. The z axis is the vertical axis, the x and y axes are horizontal. The basic structure is a cross formed by a first nanowire 100 extending in the x direction and a second nanowire 110 extending in the y direction which cross each other at a junction 115.

The magnetic domains 114 hosted in the nanowires 100 and 110 are illustrated with arrows indicating the magnetic moment in the conventional way. Each domain is bounded by a domain wall 112. As is understood in the art, the nanowire domain walls fall into two types, head-to-head domain walls, such as the illustrated domain wall 112 and tail-to-tail domain walls, the meaning of which will be self-explanatory. Head-to-head domain walls carry positive magnetostatic charge and tail-to-tail domain walls carry negative magnetostatic charge. The positive and negative charges associated with the domain walls are also schematically illustrated. It will thus be understood that the nanowires 100 and 110 constitute domain wall conduits made of magnetic material having sufficient shape anisotropy that the magnetic moment of the domains aligns with the principal axis of the nanowire. It will be appreciated that the magnetic alignment in the region of the domain walls is more complex as will be understood from the prior art [13, 14] and described in more detail further below.

The first and second nanowires 100 and 110 are co-planar. The first and second nanowires can be of the same widths and same thicknesses, or they may differ. The illustrated portion of the first nanowire 100 has a domain wall 112, illustrated as a head-to-head domain wall, located on the left hand side of the cross structure to the left of the junction 115. The −x aligned domain to the right of the domain wall 112 extends through the region of the junction 115. The domain wall 112 is a transverse domain wall and has a +y chirality as indicated by the small arrow located at the domain wall 112, which is referred to as an 'up' chirality throughout the following. The second nanowire 110 has a single domain aligned in the +y direction extending through the junction 115. It can thus be seen that the domain in the second nanowire is aligned with the domain wall in the first nanowire. With this aligned configuration it is energetically favored for the domain wall to move from the arm of the nanowire to the junction, where it will become pinned. In other words, the junction is a pinning site that forms a potential well for a domain wall in the aligned configuration. Experiments by the inventors have shown that this potential well is of moderate strength, somewhat smaller than the nucleation field, but larger than the operating field.

Figure 3B:
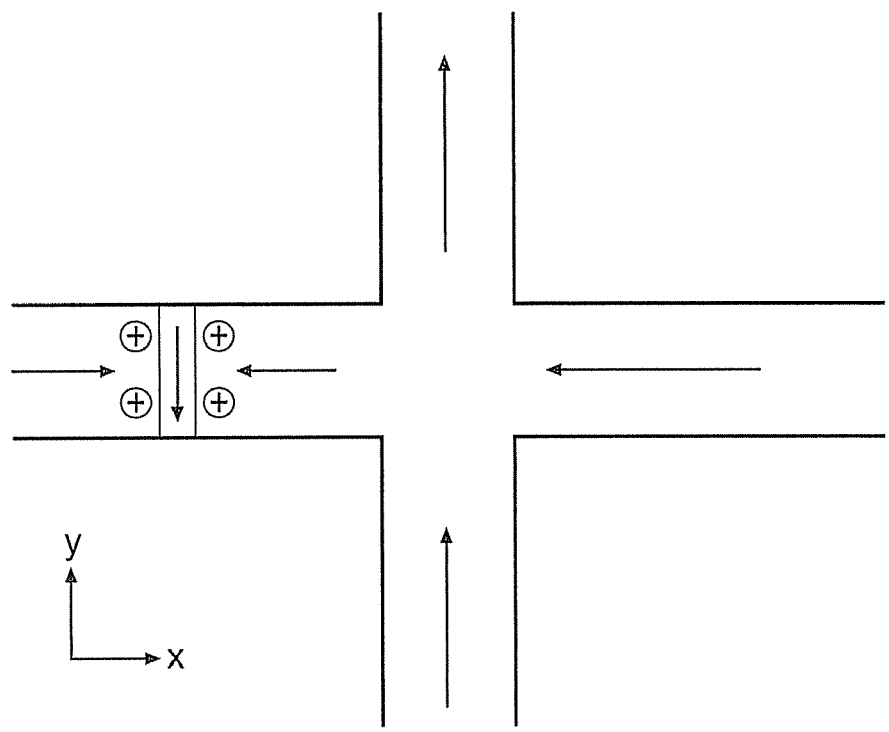
FIG. 3B is a schematic plan view representation of a nanowire structure embodying to the invention to illustrate a second basic state exploited by devices according to the invention.

FIG. 3B is a schematic plan view representation of the same nanowire structure as FIG. 3A, but shows a different configuration of the various domains. The only difference between FIGS. 3A and 3B is in the chirality of the transverse domain wall. In FIG. 3B the domain wall 112 is a transverse domain wall with −y chirality, which is referred to as a 'down' chirality throughout the following. The domain in the second nanowire is anti-aligned with the domain wall in the first nanowire. With this anti-aligned configuration, experiments by the inventors have shown that the junction forms a potential barrier of relatively high strength, larger than the nucleation field. It is thus energetically favored for a domain wall in this configuration to remain offset from the junction in the position schematically illustrated.

In summary, the alignment or anti-alignment between the domain in the second nanowire and the domain wall in the first nanowire determines whether the cross junction constitutes an (attractive) potential well or a (repulsive) barrier to domain walls in the first nanowire. This basic observation is exploited by the invention to generate a serial memory device. The manner in which manipulation of such a cross structure can be used as a basis for a serial memory device is now described.

The following four figures illustrate the four possible permutations of domain wall in the first nanowire. The four figures deal with in turn: a head-to-head domain wall with an 'down' chirality; a head-to-head domain wall with an 'up' chirality; a tail-to-tail domain wall with an 'down' chirality; and a tail-to-tail domain wall with an 'up' chirality.

FIG. 4A to 4H show a sequence of configurations of the cross structure in the case of a head-to-head domain wall with a 'down' chirality.

Figure 4A:
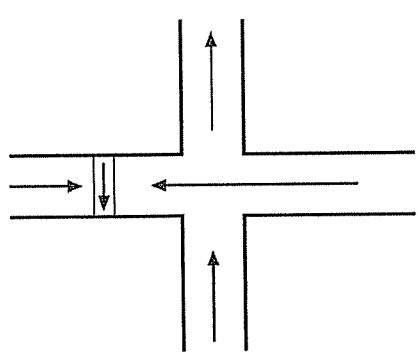
FIG. 4A to 4H show a sequence of configurations of the cross structure in the case of a head-to-head domain wall with a 'down' chirality.

FIG. 4A illustrates the same configuration as FIG. 3B in which the first nanowire has a head-to-head domain wall with a "down" chirality to the left of the junction which is anti-aligned with a domain in the second nanowire with a field pointing in the +y direction.

Figure 4B:
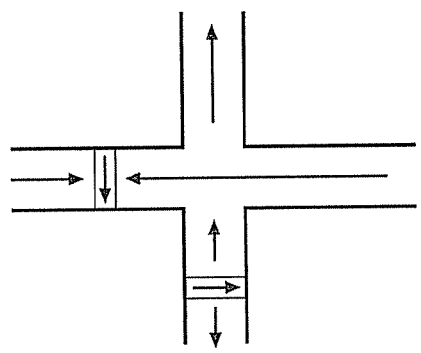

FIG. 4B shows a domain wall in the second nanowire that is moving in the +y direction and approaching the junction.

Figure 4C:
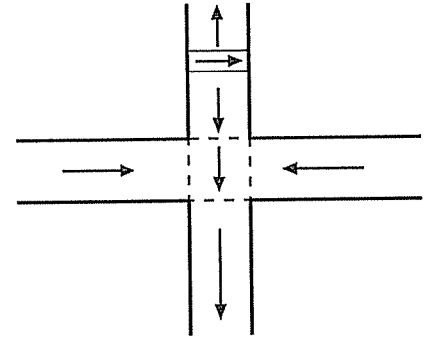

FIG. 4C shows the situation after this domain wall has passed through the junction, now being located above the junction. The domain in the second nanowire in the region of the junction is now reversed in polarity and has a field pointing in the −y direction, which is now aligned with the field associated with the transverse domain wall in the first nanowire. As discussed further above, this means that the junction is now a potential well for the domain wall in the first nanowire, which thus moves to the junction where it is pinned, as illustrated.

Figure 4D:
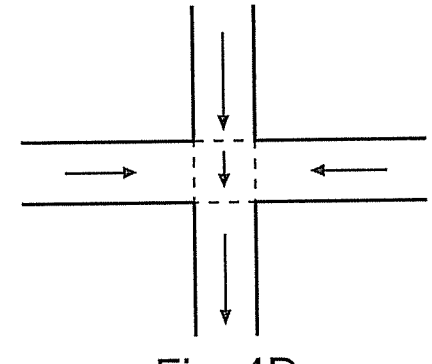

FIG. 4D illustrates this situation with the head-to-head domain wall with a down chirality pinned in the junction. The mobile domain wall in the second nanowire has passed further upwards out of view.

FIGS. 4A to 4D collectively show how reversal of the domain in the second nanowire from up to down can attract and pin, or 'suck', a head-to-head domain wall of down chirality into the junction.

The time sequence now continues further in FIGS. 4E to 4H.

Figure 4E:
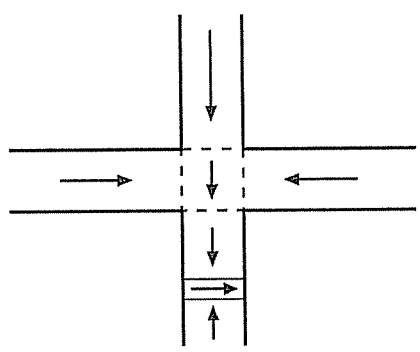

FIG. 4E shows appearance of the next upwardly traveling further domain wall in the second nanowire as it approaches the junction, wherein the junction has the head-to-head domain wall of down chirality pinned at it.

Figure 4F:
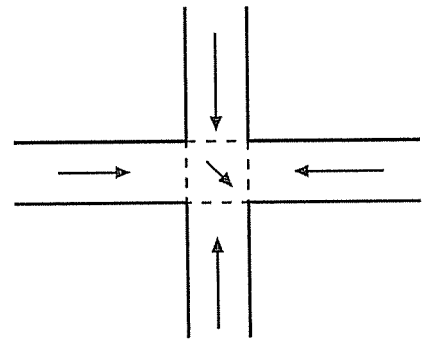

FIG. 4F shows the instance where the two domain walls coincide. At this point there is a complex interaction that is schematically illustrated by a single net field arrow pointing in the south-east direction, i.e. down and to the right.

Figure 4G:
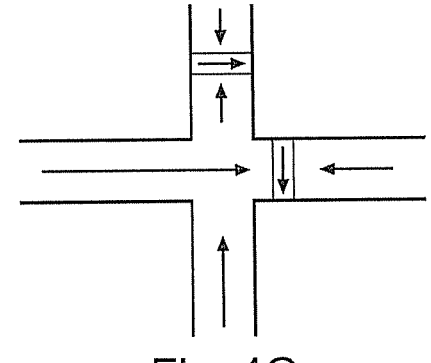

FIG. 4G shows the situation after this domain wall has passed through the junction, now being located above the junction. The domain in the second nanowire in the region of the junction is now reversed in polarity and has a field pointing in the +y direction, which is now anti-aligned with the field associated with the transverse domain wall in the first nanowire. The upwardly pointing domain field in the second nanowire thus now forms a repelling potential barrier at the junction for the first nanowire's head-to-head domain wall, resulting in depinning of that domain wall and its ejection from the junction.

Figure 4H:
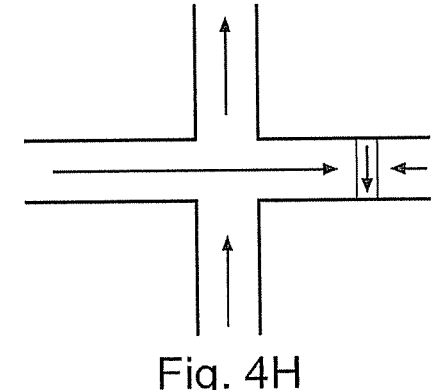

FIG. 4H shows the final step in the sequence in which the mobile domain wall in the second nanowire has passed further upwards out of view and the first nanowire's head-to-head domain wall has moved further to the right to an offset position from the junction.

FIGS. 4E to 4H collectively show how reversal of the domain in the second nanowire from down to up can repel and eject, or 'spit out', a head-to-head domain wall of down chirality from the junction.

In the above we have not mentioned the class or chirality of the domain wall in the second nanowire. The domain wall in the second nanowire is a transverse domain wall. In the illustrated example, it is aligned in the +x direction, which is referred to as 'right' chirality. The opposite alignment would be a 'left' chirality pointing in the −x direction. For the spitting action, a +x, right chirality domain wall will tend to cause ejection of a pinned domain wall from the junction in the +x direction (the illustrated example). This is believed to follow from the fact that when the two domain walls coincide at the junction, the field of the pinned domain wall will tend to rotate towards the alignment of the domain wall arriving from the second nanowire, causing the domain wall boundary effectively to be displaced in the direction in which the field of the domain wall of the second nanowire is pointing. A +x, right chirality domain wall will thus displace the head-to-head down chirality domain wall in the +x direction. For the same reason, a −x, left chirality domain wall will tend to cause ejection of a pinned head-to-head domain wall from the junction in the −x direction (not illustrated). The detail of the evolution of the magnetizations with time is evident from the simulations described further below.

If desired, it may be possible to force ejection in +x or −x direction regardless of the chirality of the domain wall in the second nanowire by application of a separate field component in the +x or −x direction respectively, thereby overriding the above described tendency.

Another possibility would be to make the second nanowires larger in cross-section, e.g. wider, than the first nanowires so that they preferentially form vortex domain walls and not transverse domain walls. It may be the case that the sensitivity of the transverse domain wall in the first nanowire to chirality of the domain wall in the second nanowire during ejection does not occur when the second nanowire hosts vortex domain walls.

FIG. 5A to 5H show a sequence of configurations of the cross structure in the case of a head-to-head domain wall with an 'up' chirality.

Figure 5A:
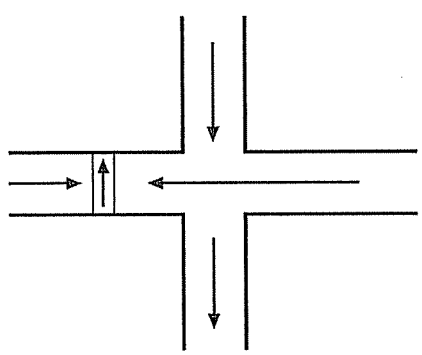
FIG. 5A to 5H show a sequence of configurations of the cross structure in the case of a head-to-head domain wall with an 'up' chirality.

FIG. 5A illustrates a configuration in which the first nanowire has a head-to-head domain wall with 'up' chirality to the left of the junction which is anti-aligned with a domain in the second nanowire with a field pointing in the −y direction.

Figure 5B:
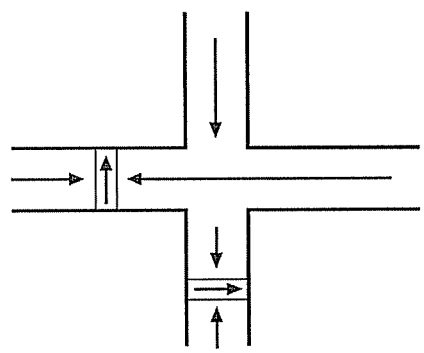

FIG. 5B shows a domain wall in the second nanowire that is moving in the +y direction and approaching the junction.

Figure 5C:
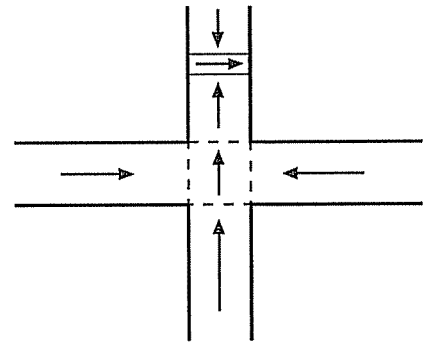

FIG. 5C shows the situation after this domain wall has passed through the junction, now being located above the junction. The domain in the second nanowire in the region of the junction is now reversed in polarity and has a field pointing in the +y direction, which is now aligned with the field associated with the transverse domain wall in the first nanowire. As discussed further above, this means that the junction is now a potential well for the domain wall in the first nanowire, which thus moves to the junction where it is pinned, as illustrated.

Figure 5D:
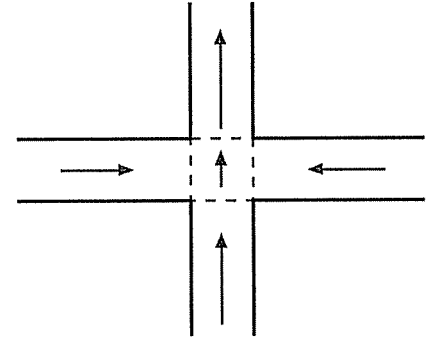

FIG. 5D illustrates this situation with the head-to-head domain wall with up chirality pinned in the junction. The mobile domain wall in the second nanowire has passed further upwards out of view.

FIGS. 5A to 5D collectively show how reversal of the domain in the second nanowire from down to up can attract and pin, or 'suck', a head-to-head domain wall of up chirality into the junction.

The time sequence now continues further in FIGS. 5E to 5H.

Figure 5E:
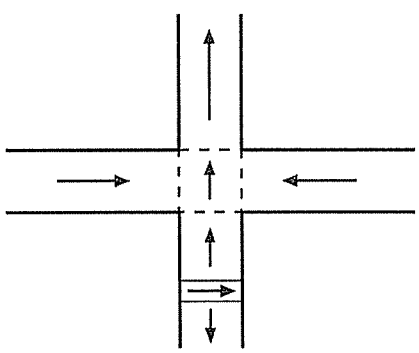

FIG. 5E shows appearance of the next upwardly traveling further domain wall in the second nanowire as it approaches the junction, wherein the junction has the head-to-head domain wall of up chirality pinned at it.

Figure 5F:
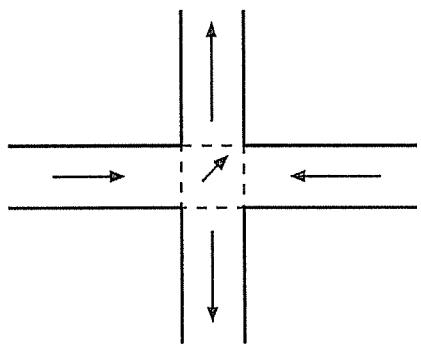

FIG. 5F shows the instance where the two domain walls coincide. At this point there is a complex interaction that is schematically illustrated by a single net field arrow pointing in the north-east direction, i.e. up and to the right. The field of the pinned domain wall has thus rotated towards the alignment of the right chirality transverse domain wall arriving from the second nanowire.

Figure 5G:
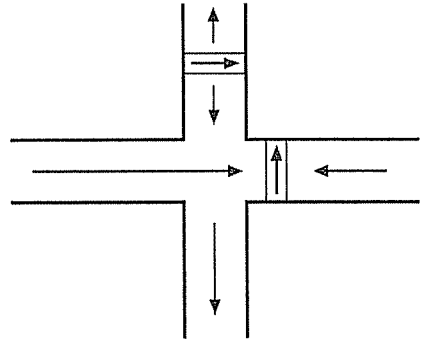

FIG. 5G shows the situation after this domain wall has passed through the junction, now being located above the junction. The domain in the second nanowire in the region of the junction is now reversed in polarity and has a field pointing in the −y direction, which is now anti-aligned with the field associated with the transverse domain wall in the first nanowire. The downwardly pointing domain field in the second nanowire thus now forms a repelling potential barrier at the junction for the first nanowire's head-to-head domain wall, resulting in depinning of that domain wall and its ejection from the junction.

Figure 5H:
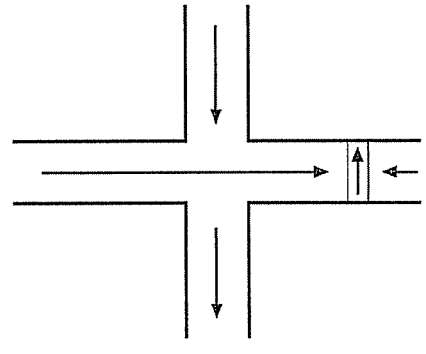
Figure 6A:
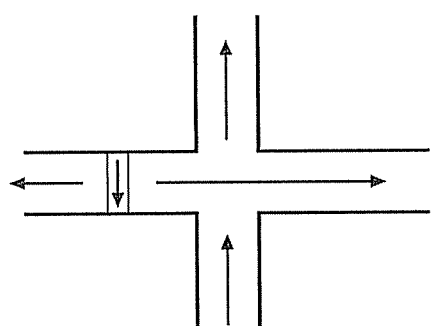
FIG. 6A to 6H show a sequence of configurations of the cross structure in the case of a tail-to-tail domain wall with an 'down' chirality.
Figure 6B:
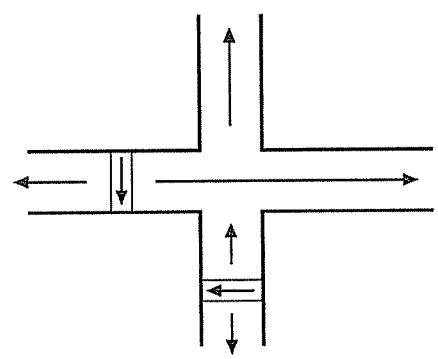
Figure 6C:
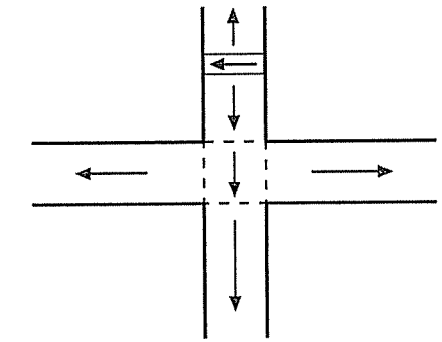
Figure 6D:
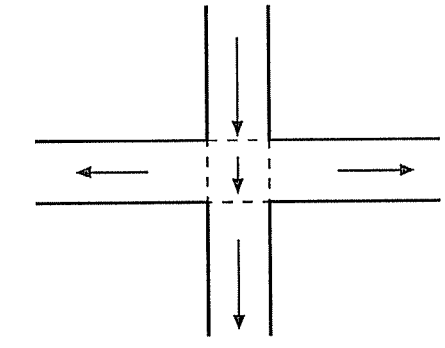
Figure 6E:
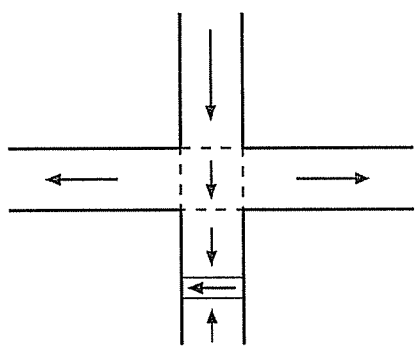
Figure 6F:
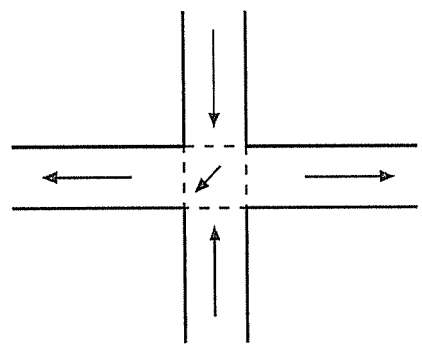
Figure 6G:
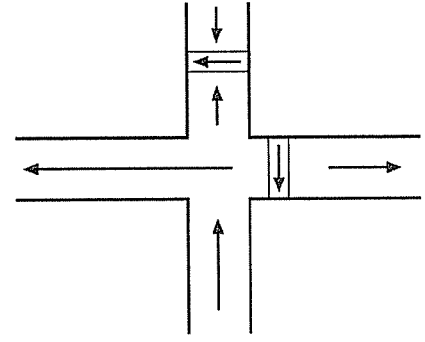
Figure 6H:
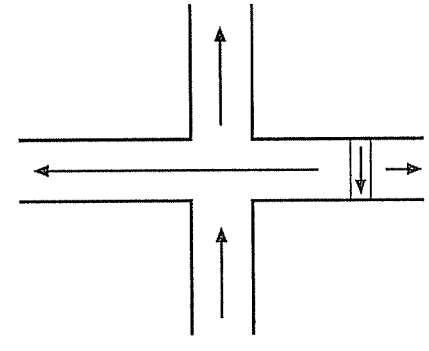
Figure 7A:
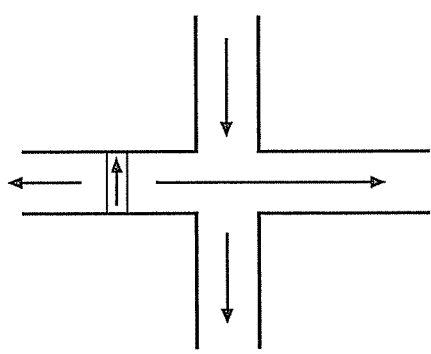
FIG. 7A to 7H show a sequence of configurations of the cross structure in the case of a tail-to-tail domain wall with an 'up' chirality.
Figure 7B:
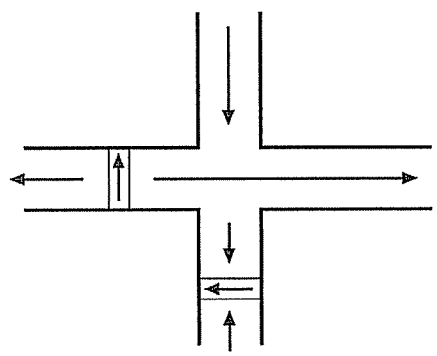
Figure 7C:
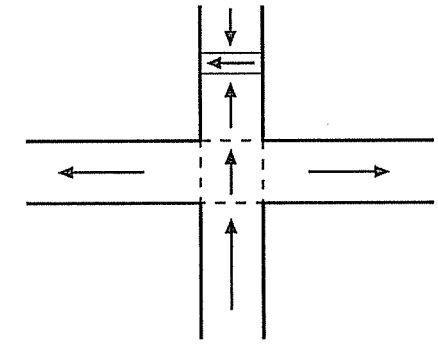
Figure 7D:
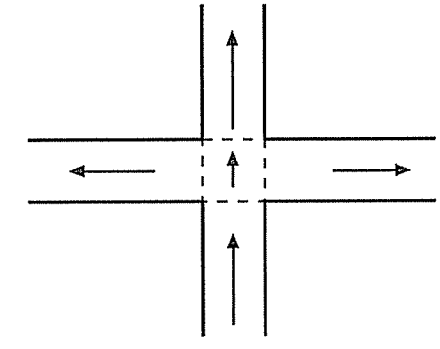
Figure 7E:
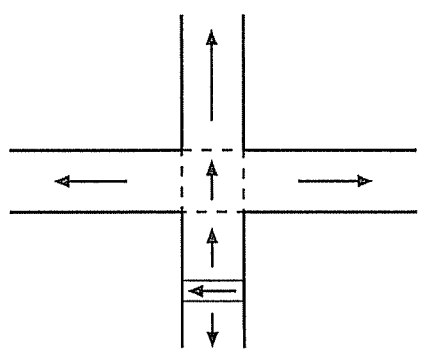
Figure 7F:
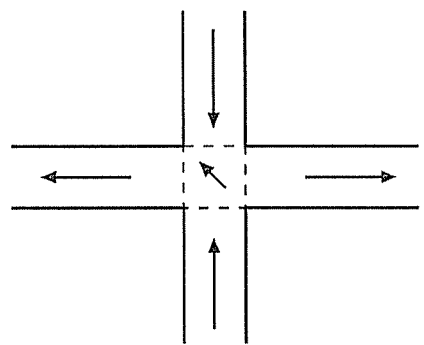
Figure 7G:
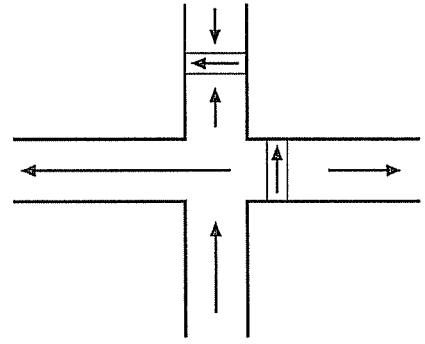
Figure 7H:
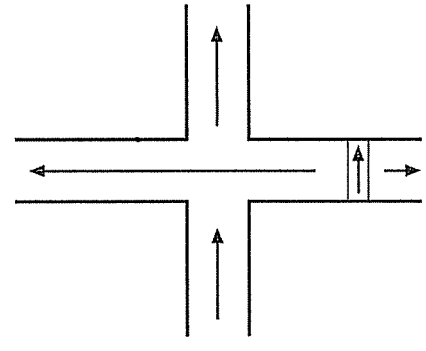

FIG. 5H shows the final step in the sequence in which the mobile domain wall in the second nanowire has passed further upwards out of view and the first nanowire's head-to-head domain wall has moved further to the right to an offset position from the junction.

FIGS. 5E to 5H collectively show how reversal of the domain in the second nanowire from up to down can repel and eject, or 'spit out', a head-to-head domain wall of up chirality from the junction.

Having now described the situation for a head-to-head domain wall in the first nanowire, the similar situation for tail-to-tail domain wall in the first nanowire is now described.

FIG. 6A to 6H show a sequence of configurations of the cross structure in the case of a tail-to-tail domain wall with an 'down' chirality.

The sequence is directly analogous to that of FIGS. 4A to 4H except that it is noted that the domain walls in the second nanowire are shown to be oriented in the −x direction. This is to induce rightward, i.e. +x direction, ejection of pinned domain walls in the spit phase of FIGS. 6E to 6H.

FIG. 7A to 7H show a sequence of configurations of the cross structure in the case of a tail-to-tail domain wall with an 'up' chirality. The sequence is directly analogous to that of FIGS. 5A to 5H except that it is noted that the domain walls in the second nanowire are shown to be oriented in the −x direction. This is to induce rightward, i.e. +x direction, ejection of pinned domain walls in the spit phase of FIGS. 7E to 7H.

Reviewing the above four sequences, it is apparent that successive domain reversals in the second nanowire cause transverse domain walls in the first nanowire to be moved through the junction in the +x direction by a two-step sucking and spitting action. This is true for all domain wall types, namely for head-to-head or tail-to-tail domain walls, and for domain walls of up or down chirality. Additionally, the chirality of the transverse domain wall in the second nanowire used to induce the domain reversal in the second nanowire should be in the +x direction for head-to-head domain walls and the −x direction for tail-to-tail domain walls.

It will thus be appreciated that, if the first nanowire is crossed by multiple second nanowires, it is possible to move multiple domains together along the first nanowire by simultaneous successive domain reversals in the second nanowires. This is an important result, since the suck-and-spit action moves both head-to-head and tail-to-tail domain walls together. The fact that head-to-head and tail-to-tail domain walls are associated with opposite charge accumulations is not relevant to this process. It is thus possible with a global alternating magnetic field, switching between +y and −y, to move a pipeline of domains along the first nanowire in the +x direction from junction to junction.

Further the magnetic domains can encode a bit of data through the chirality of the transverse domain wall, since the suck-and-spit action is insensitive to chirality of the transverse domain wall in the first nanowire. Here we arbitrarily choose up chirality to encode 1's and down chirality to encode 0's.

In the following, we refer to the first nanowires as data nanowires and the second nanowires as clocking nanowires. Further, we refer to the domain walls in the first nanowires as data-carrying domain walls, and the domain walls in the second nanowires as clocking domain walls, since they serve to clock the data-carrying domain walls through the junctions.

Clocking of data through a data nanowire is now described with reference to the following figures.

Figure 8A:
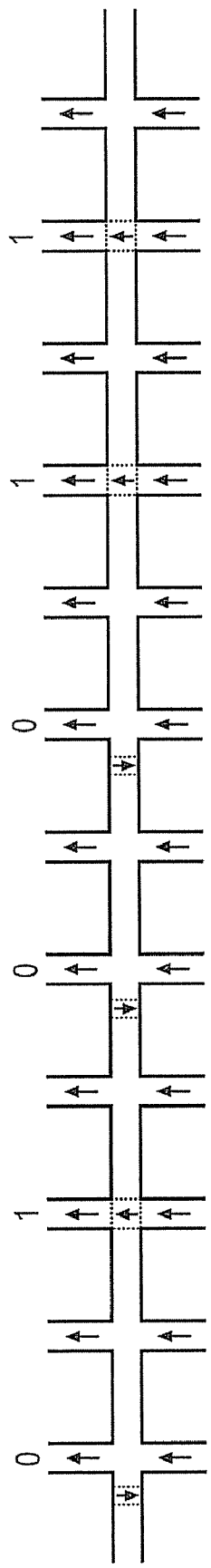
FIGS. 8A to 8C show a sequence of three successive timing intervals for a data nanowire crossed by multiple clocking nanowires.
Figure 8B:
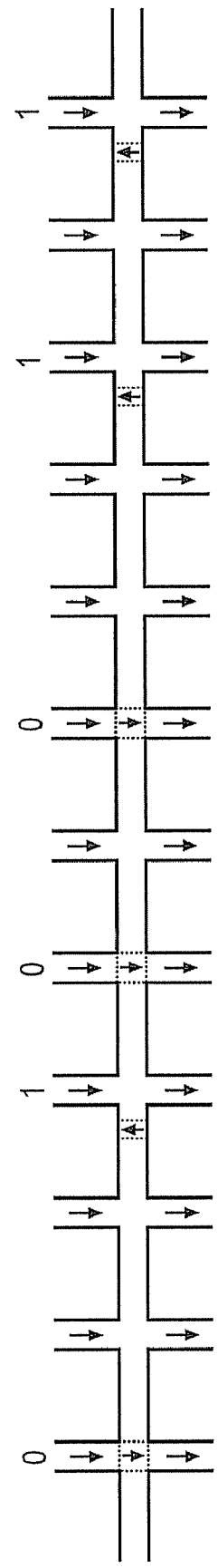
Figure 8C:
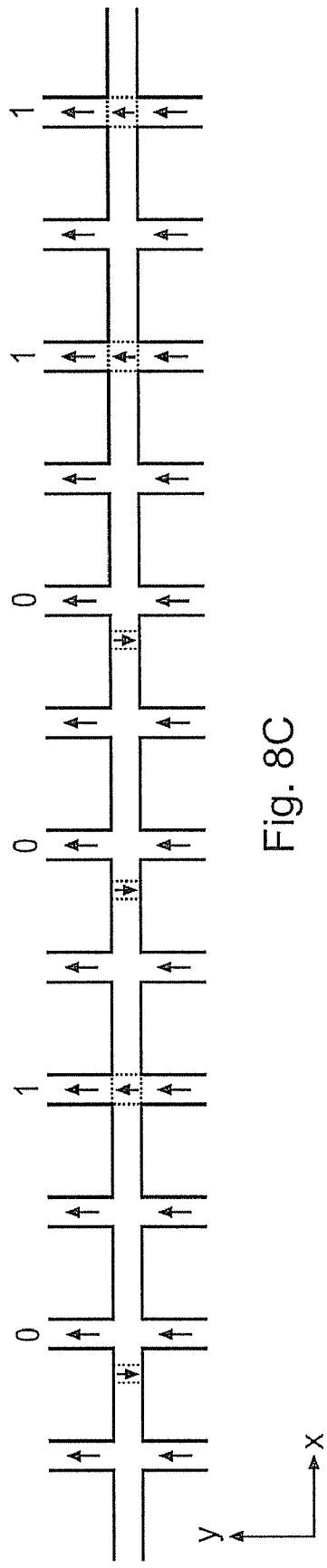

FIGS. 8A to 8C show a sequence of three successive timing intervals for a data nanowire crossed by multiple clocking nanowires. To simplify the graphical representation, the only fields indicated are the domain field in the clocking nanowires and the chirality field in the data-carrying domain walls in the data nanowire. The domain fields in the clocking nanowires are all aligned in the same way at any given time. More specifically, at the first time shown in FIG. 8A the domain fields in the clocking nanowires are up, then they are reversed to down in FIG. 8B and again reversed to up in FIG. 8C.

Referring to FIG. 8A, six data-carrying domain walls are shown and carry the bit sequence 010011, this sequence being arbitrarily selected by way of example only. The data-carrying domain walls are located at every second junction. The aligned configuration, attractive junctions, which are the 1's in FIG. 8A, have the data-carrying domain walls located at the junction, whereas the anti-aligned configuration, repelling junctions, which are the 0's in FIG. 8A, have the data-carrying domain walls offset from the junction. Nevertheless, 0's as well as 1's are associated with one of the junctions, as illustrated by the locations of the 0's and 1's in the figure.

When the clocking domains are reversed to arrive at FIG. 8B, the 0's stay at the same junctions, but move from an offset to a pinned position as a result of their configuration having changed from anti-aligned to aligned. This is a suck action. The 1's move to the next junctions as a result of their configuration having changed from aligned to anti-aligned. This is a spit action which results in movement from a pinned position in one junction to an offset position in the neighboring junction.

When the clocking domains are reversed again to arrive at FIG. 8C, the 1's stay at the same junctions and the 0's are moved to the next junctions. The net effect of the two domain reversals is to move all the data-carrying domain walls along by one junction. It will be appreciated that this process can be repeated to move the data along the data nanowire, with each cycle being performed by reversing the clocking domains twice to cause a spit action and a suck action.

It is noted that the domain walls swept through the clocking nanowires should alternate appropriately between +x and −x chirality to ensure that they can propagate through the junction in the desired manner.

Figure 9:
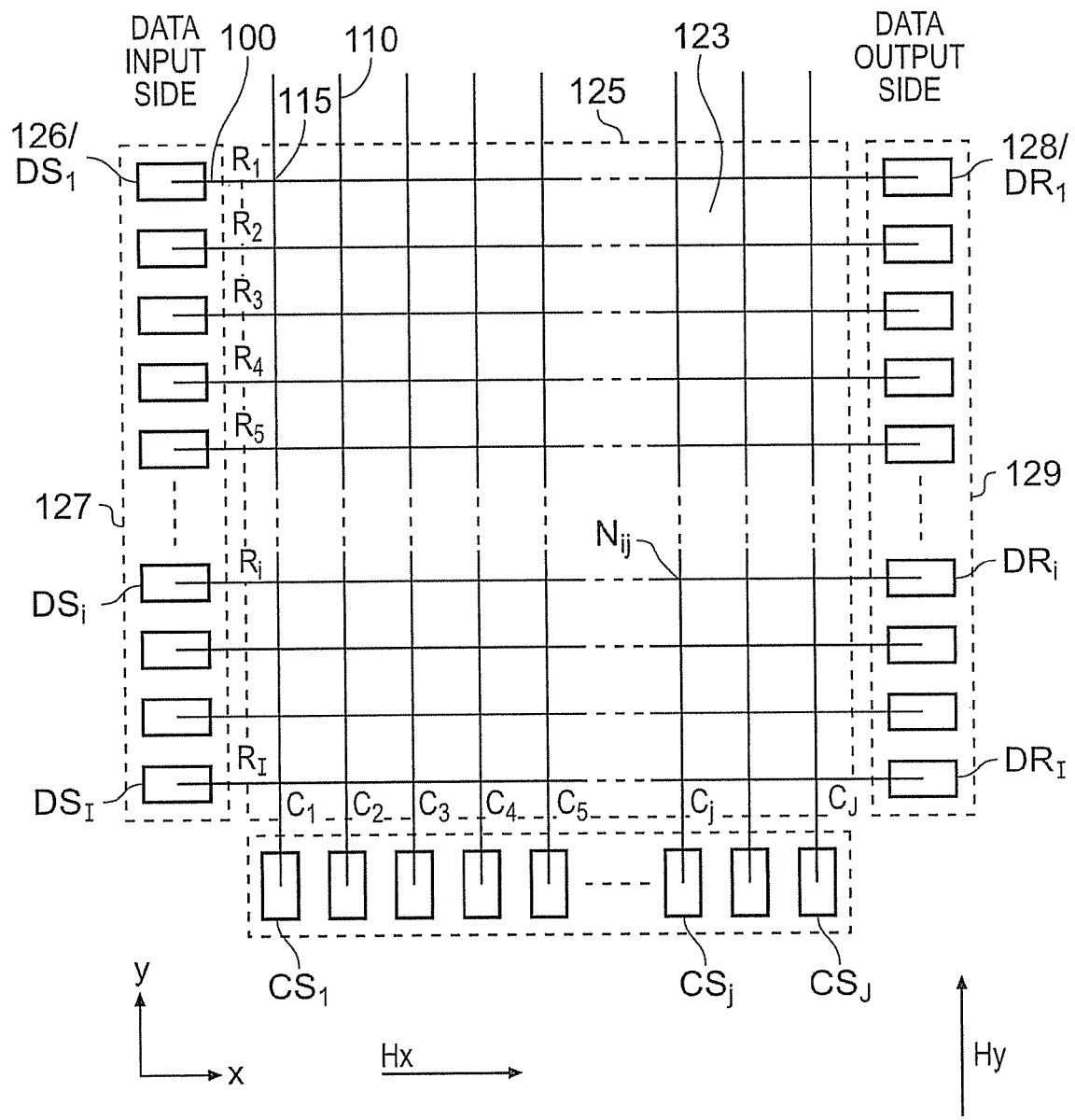
FIG. 9 is a schematic plan view system-level representation of a single layer device embodying the invention.

FIG. 9 is a schematic plan view system-level representation of a memory device embodying the invention. The main central area of the device is formed of a two-dimensional array of I data-carrying nanowires 100 extending parallel to each other in the x direction, labeled as rows $R_1$, $R_2$, $R_3$ ... $R_i$ ... $R_I$, and J clocking nanowires 110 extending parallel to each other in the y direction, labeled as columns $C_1$, $C_2$, $C_3$ ... $C_j$ ... $C_J$, which together form a junction grid extending over an area 125 indicated by the dashed line box. The nanowires 100 and 110 are co-planar and cross at junctions 115, labeled nodes $N_{ij}$ to indicate the row and column number of the crossing nanowires. The nanowire grid is fabricated together as a single deposited layer, wherein the magnetic material for the nanowires is separated by islands of non-magnetic material 123, such as $SiO_2$ for example. Standard lithographic techniques can be used to etch a grid in a, for example, $SiO_2$ layer followed by deposition of the, for example, Py, and lift off of the excess Py that covers the $SiO_2$ islands to complete the illustrated structure. Each data-carrying nanowire $R_i$ has a data source or read-in element 126/$DS_i$ and a data receiver or read-out element 128/$DR_i$ positioned respectively to the left and right sides of the junction grid 125 on data input and output sides of the device respectively. The read-in elements $DS_i$ are operable to nucleate a domain in the row $R_i$ bounded by a transverse domain wall of a pre-determined chirality that encodes the data bit being read in. The data read-in elements $DS_i$ collectively form a data read-in part 127 of the device. The data read-out elements $DR_i$ are operable to sense the chirality of a transverse domain wall once it is ejected from the Jth junction, i.e. the last junction in the grid 125. The data read-out elements $DR_i$ collectively form a data read-out part 129 of the device. Each clocking nanowire $C_j$ has a clocking source $CS_j$ arranged adjacent the grid 125. Each clocking source $C_j$ is operable to nucleate a domain in the column $C_j$ bounded by a transverse domain wall of a pre-determined chirality selected to ensure that head-to-head and tail-to-tail domain walls that appear alternately at the nodes $N_{ij}$ of a given row are clocked with light and left chirality transverse domain walls respectively. The clocking sources $CS_j$ collectively form a clocking domain generation part 131 of the device. It will be understood that the nanowire array and associated circuit elements will be fabricated on a substrate using lithographic processes.

Also shown in the figure is a clocking field $H_y$ which is pulsed with a square wave modulation to alternate between +y and −y alignment at a constant magnitude which is above the operation field for the clocking nanowires, but below the nucleation field thereof. A drive field $H_x$ may also be provided, as shown, which is for applying a force in the +x direction to data-carrying domain walls to ensure that they propagate exclusively in the intended left-to-right direction through the device. The drive field will have a strength greater than the operation field for the data-carrying nanowires and less then the depinning field for aligned crosses, i.e. crosses that form potential wells, as described above with reference to FIG. 3A. The drive field may be constant or if desired pulsed in synchronization with the clocking field. A drive field may not be required if the data-carrying domain walls propagate naturally through the structure. If a drive field is provided, this may obviate the need to control the chirality of the domain walls in the clocking nanowires, as mentioned previously.

Figure 10:
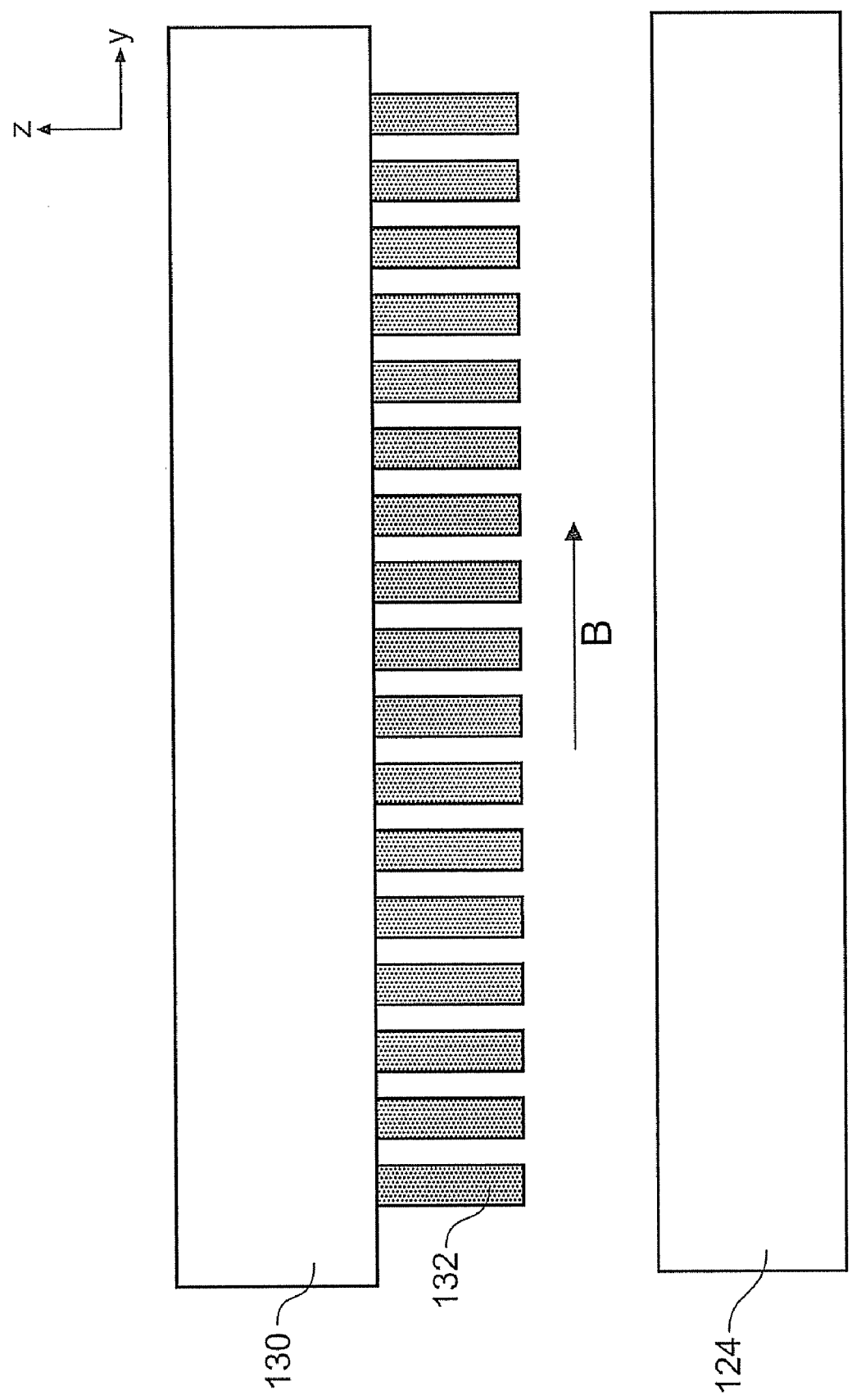
FIG. 10 is a schematic side section view of a magnetic field source for a memory device embodying the invention in the yz plane.

FIG. 10 is a schematic side section view in the yz plane of a magnetic field source 130 for providing the clocking field. The substrate 124 which bears the previously described nanowire array and associated read-in, read-out and clocking elements is also shown. The source 130 provides a linear magnetic field B in the +y direction as determined by the current flow direction through the source. The source is of the well known strip line design with an array of elements 132 extending in the z-direction. The source 130 may be integrated with the substrate 124 through flip chip bonding or other techniques.

If a drive field is also needed by the device, a second strip line source of this kind can be provided, which will be orthogonally aligned, i.e. an equivalent figure to FIG. 10 would be in the xz plane to provide a linear magnetic field in the +x direction.

Figure 11A:
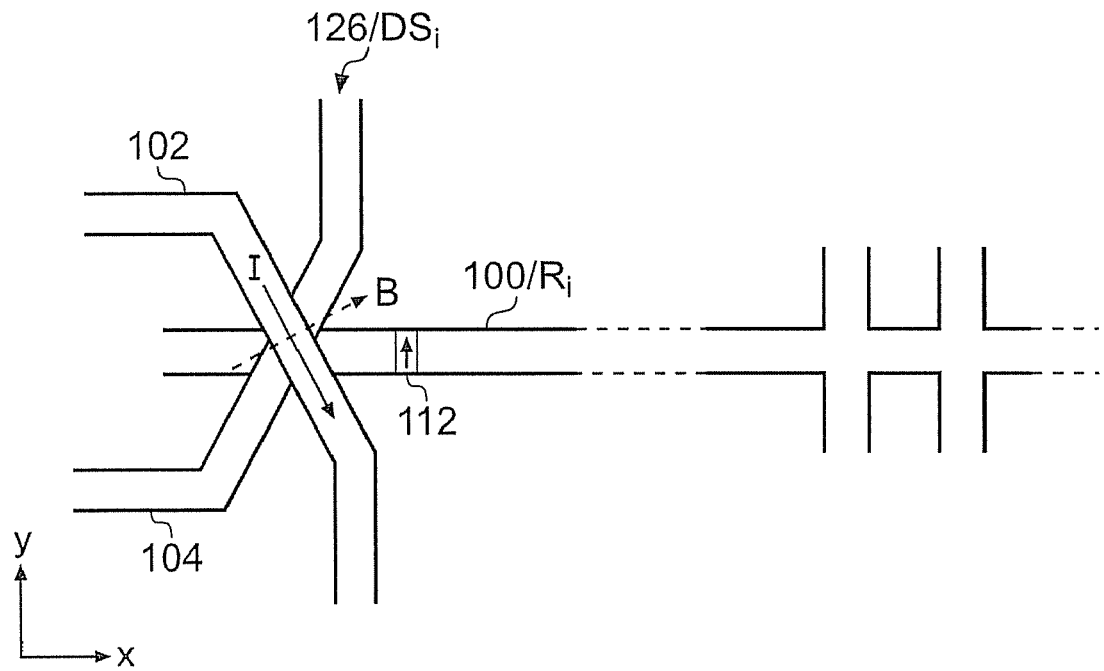
FIG. 11A is a schematic plan view representation of a nanowire structure embodying the invention showing a data read-in part for nucleating domain walls of defined chirality.

FIG. 11A is a schematic plan view representation of a nanowire structure embodying the invention showing a data read-in part $DS_i$ for nucleating domain walls of defined chirality. The data read-in part $DS_i$ has the nanowire $100/R_i$ extending through it and comprises first and second current wires 102 and 104 having portions that cross over the nanowire at opposite slanting angles. There is an insulating layer (not shown) between the wires 102 and 104 and the nanowire 100. The wires 102 and 104 are also isolated from each other by a suitable insulating layer (not shown). They may be both above or both below the nanowire, or one below and one above. Referring to the first current wire 102, when it is actuated to carry a current I, a magnetic field B at right angles to the wire is induced as illustrated. If this field results in a field greater than the nucleation field being applied to the nanowire, a domain is formed in the nanowire, with a domain wall aligned with the B field component, i.e. in the +x direction (up chirality) in the illustrated example. This is because the slanted portion of wire 102 results in the induced B field having a component in the +y direction. Similarly the opposite slant of the portion of wire 104 will result in a domain wall of the other chirality being induced, i.e. in the −x direction (down chirality). In an alternative embodiment, one wire is used and the current direction is reversed to produce the different chiralities.

Figure 11B:
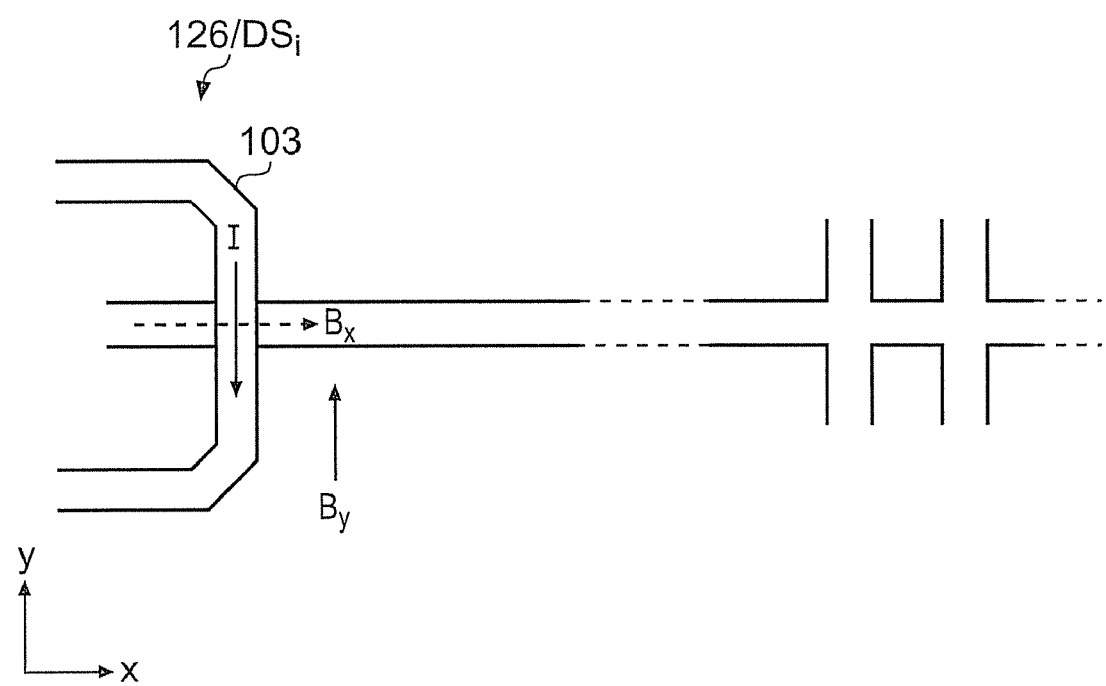
FIG. 11B is a schematic plan view representation of a nanowire structure embodying the invention showing an alternative data read-in part.

FIG. 11B is a schematic plan view representation of a nanowire structure embodying the invention showing an alternative data read-in part $DS_i$ for nucleating domain walls of defined chirality. The data read-in part $DS_i$ has the nanowire $100/R_i$ extending through it and comprises a single current wire 103 having a portion that crosses over the nanowire at right angles thereto, i.e. in the y direction. When the wire 103 is actuated to carry a current I, a magnetic field $B_x$ at right angles to the wire is induced as illustrated. If this field is greater than the nucleation field of the nanowire, a domain is formed in the nanowire. In the absence of any further fields, the domain wall thereby created is equally likely to be of up or down chirality. However, if the wire is actuated at the same time as a further magnetic field $B_y$ is applied having a component in the y direction, then the chirality of the domain wall be selected by the direction of that field component. For example, the clocking field generated by the above-described magnetic field source 130 may also be used for this purpose, since it is in the y direction and can be alternated between +y and −y alignment. Alternatively, a further, independently actuatable magnetic field source may be provided for setting the chirality of the domain walls nucleated by the wire 103.

Figure 12:
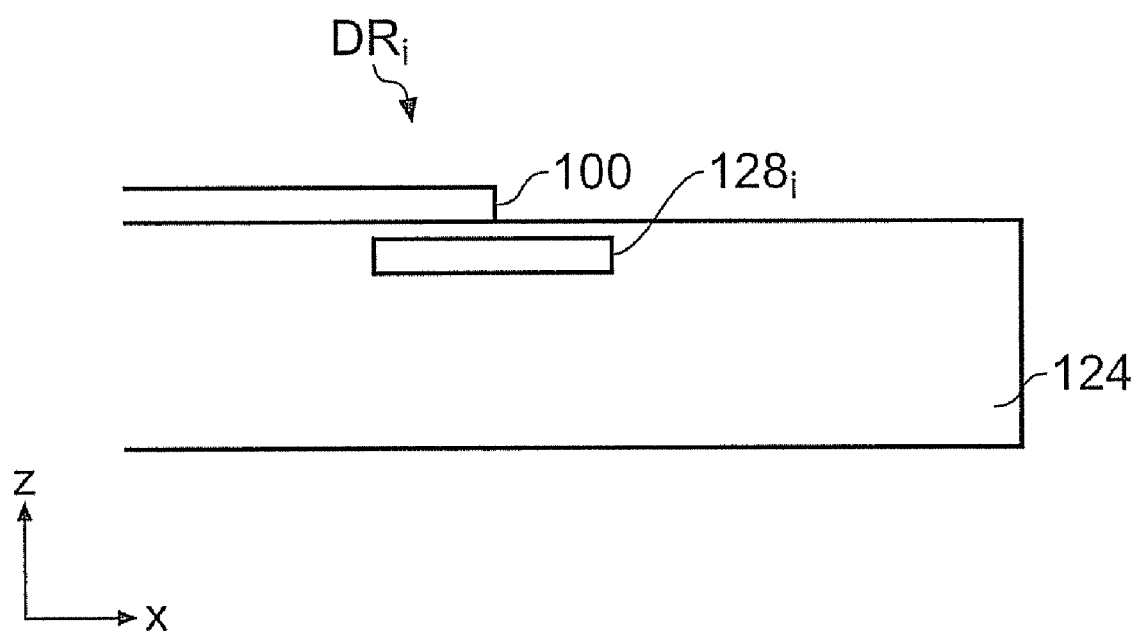
FIG. 12 is a schematic plan view representation of a nanowire structure embodying the invention showing a data read-out part for sensing the chirality of transverse domain walls.

FIG. 12 is a schematic plan view representation of a nanowire structure embodying the invention showing a data read-out part $128/DR_i$ for sensing the chirality of transverse domain walls. A nanowire 100 arranged on the substrate 124 has, in the region of its termination to the right side of the device, a magnetic field detector 128 embedded in the substrate 124. The magnetic detectors are integrated in the silicon (or other semiconductor) of the substrate. Here it will be understood that term substrate is used loosely as an umbrella term for the underlying semiconductor structure including conventional epitaxial layers, doping regions and so forth, rather than in a strict sense to refer to a bare unprocessed wafer portion.

The magnetic detectors 28; of the rows $R_i$ serve to detect the presence either of a domain wall, including its chirality, by detecting stray field from the end portion of their associated nanowire 100. It will be appreciated that the nanowire pipeline is thus providing a FIFO type serial memory in that the data is input at one end of the nanowire and read out of the other end. The magnetic detectors may be based on magnetic tunnel junctions, spin valves or the Hall effect (e.g. Bismuth or InSb) for example as is known in the art. Another alternative would be to have a magnetic detector in direct electrical contact with the nanowires, such that the nanowires form the so-called free layer of a magnetic tunnel junction or spintronic device.

This completes the description of a single layer embodiment of the device of the invention which provides a two-dimensional memory structure. A multi-layer embodiment is now described which provides a three-dimensional memory structure. The basic operating principles and circuit elements of the multi-layer embodiment are the same as the single-layer embodiment. The basic difference is that multiple nanowire grids are arranged on top of each other, separated by suitable insulating material. It is one of the key advantages of the basic operating principles that the device is readily scalable to the third dimension to increase storage density.

Figure 13:
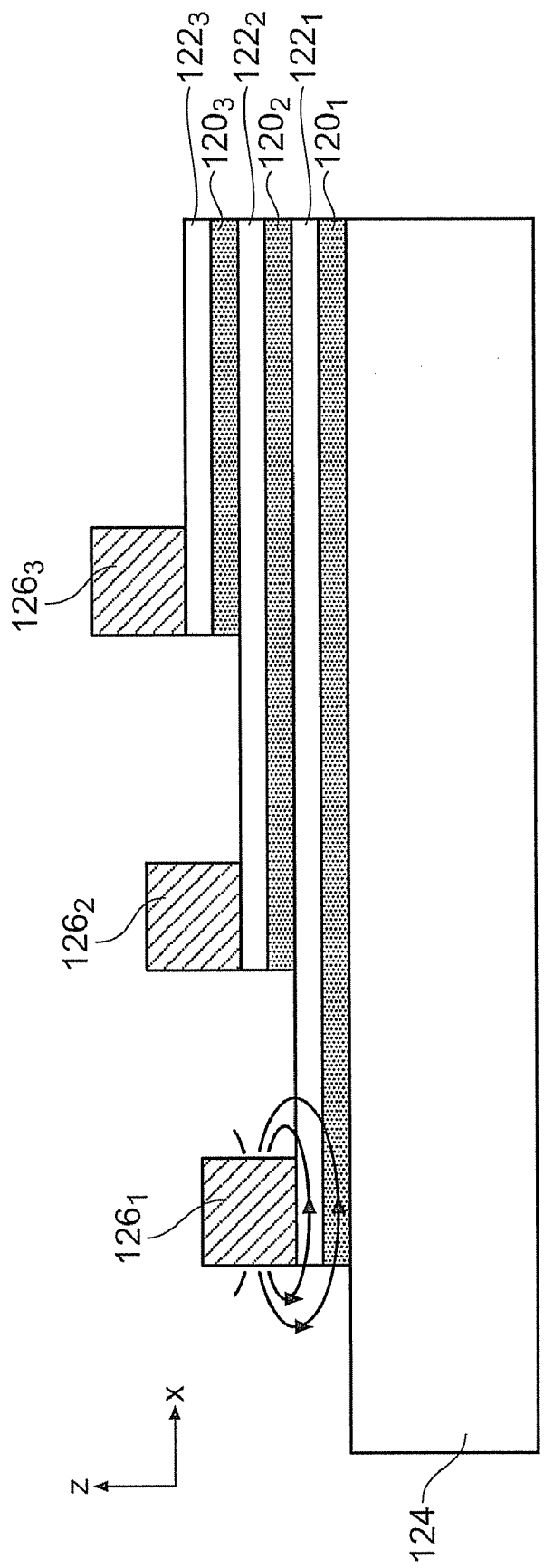
FIG. 13 is schematic side section view in the xz plane of an input side of a multi-layer memory device according to a further embodiment of the invention.

FIG. 13 is schematic side section view in the xz plane of an input side of a multi-layer memory device according to a further embodiment of the invention. The figure shows a stack of nanowire grids. Each layer 120 is formed by the nanowire grid of magnetic material separated by islands 123 of non-magnetic material. The nanowire grid layers 120 are separated from each other in the z-direction by non-magnetic material layers 122 which may be made of the same material as the islands. Three pairs of magnetic and non-magnetic layers are shown by way of example. As previously mentioned, the nanowires may be made of Permalloy or other magnetic material. The non-magnetic material may be any conveniently fabricated materials with suitable electrical and thermal insulating properties that are compatible with the magnetic material and the various connecting wires for inducing domain nucleation. For example, the non-magnetic material may be silicon dioxide ($SiO_2$) or silicon nitride ($Si_3N_4$), aluminum oxide ($Al_2O_3$), aluminum nitride (AlN) or some other material generally compatible with the device integration.

The thickness of the non-magnetic spacer layers 122 between the nanowire grid layers 120 should be large enough to minimize magnetostatic interlayer coupling between domains in neighboring layers. However, it should not be thicker than necessary, since it will merely increase the total thickness of the stack without benefit, thus making it more difficult to fabricate. A non-magnetic layer thickness of around 50 nm, e.g. 30-70 nm or 20-80 nm is probably close to the optimum.

In a real device there may be any desired number of nanowire grid layers 120. The device structure is inherently scalable in the z-direction, which is one of its key advantages, so a large number of nanowire layers may be provided. In particular, it is envisaged that 10-1000 or 100-1000 or more nanowire grid layers may be provided in a device. The memory storage capacity will scale essentially linearly with the number of layers so will influence the choice of the number of layers in any given device.

Returning to the figure, it is evident that each nanowire layer (and its accompanying overlying non-magnetic layer) terminates in the −x-direction before the end of the nanowire layer below it, so the nanowire layers are staggered in the x-direction to form a terracing or stepped structure through successive termination of the uppermost pair of layers. On each step there is shown a single metal or metallic electrode 126 that extends in the y-direction (out of the plane of the figure). These are the electrodes forming the nucleation inducing wires of the data read-in units described above. One such electrode is provided for each nanowire, so there are as many electrodes 126 on each step as there are nanowires per layer. Each electrode will have a relatively short portion extending in the y-direction over the end of the associated nanowire (the illustrated portion) and two relatively long portions leading to the interconnects that extend generally in the x-direction. The illustrated short portion of each electrode 126 is thus arranged on the non-magnetic layer and above an end portion of an associated nanowire.

The electrodes 126 are examples of nucleation field generators and can be variously referred to as domain wall injection electrodes, data input electrodes or read-in electrodes to indicate their function in the device.

The data input function is now described. The nucleation field of a nanowire reduces towards its end. Consequently, if a magnetic field is applied along the length of a nanowire which is above the locally reduced nucleation field at the nanowire end portion, but below the nucleation field in the main body of the nanowire, then a domain wall (or domain) can be created at the end portion of the nanowire.

Now consider a current applied to the central electrode $126_2$ of the figure. This will tend to create an annular magnetic field with a significant component in the x-direction in the nanowire $120_2$ lying below it, and also the bottom nanowire $120_3$ further below it. The current can be selected so that the magnetic field it generates in the nanowire $120_2$ is above the locally reduced nucleation field at the nanowire end portion, but below the nucleation field in the main body of the nanowire. Moreover, the peak magnetic field generated by the current flowing in the electrode $126_2$ is incapable of creating a domain wall in the bottom nanowire $120_3$, since to do so it would need to exceed the nucleation field for the main body of the nanowire in view of the fact that the end of the bottom nanowire $120_3$ is well separated from the electrode $126_2$.

It will thus be appreciated that the stepped structure means that each electrode $126_n$ creates a field that is local to the end region of its associated nanowire layer $120_n$ and so can selectively create domain walls only in that nanowire layer by exploiting the locally reduced nucleation field caused by end effects. Moreover, it will be appreciated that this is achieved without having to resort to 3D contacting or addressing scheme. The whole contacting and addressing scheme is kept planar, i.e. 2D, even though the memory structure, i.e. the nanowires, are arranged in 3D. The benefits of a 3D memory are thus achieved, i.e. increased memory capacity per unit chip area, without additional complexity associated with having to use a 3D contacting and addressing scheme.

The requirement to individually address each nanowire on the input side with its own electrode 126 may be the limiting factor in the packing density of the nanowires in the y-direction. For example, the nanowires may need to be separated by 1-10 μm or more at least at the external contacting location for the lead frame to provide room for the input addressing. Splaying of the wires may be used so the separation is sufficiently large at the lead frame, but reduces to a nanoscale separation where the electrodes 126 cross the nanowire end portions.

The electrodes 128, and other electrodes necessary for the device, are a pure or alloy of a metal (e.g. aluminum, gold, silver or copper) or metallic (e.g. silicide or degenerately doped semiconductor), preferably one that is non-magnetic or only weakly magnetic.

The chirality of the domain walls nucleated during this process is controlled in the manner described further above with reference to FIGS. 11A and 11B.

Having now described the data input side of the memory device, the data output side is now described.

Figure 14:
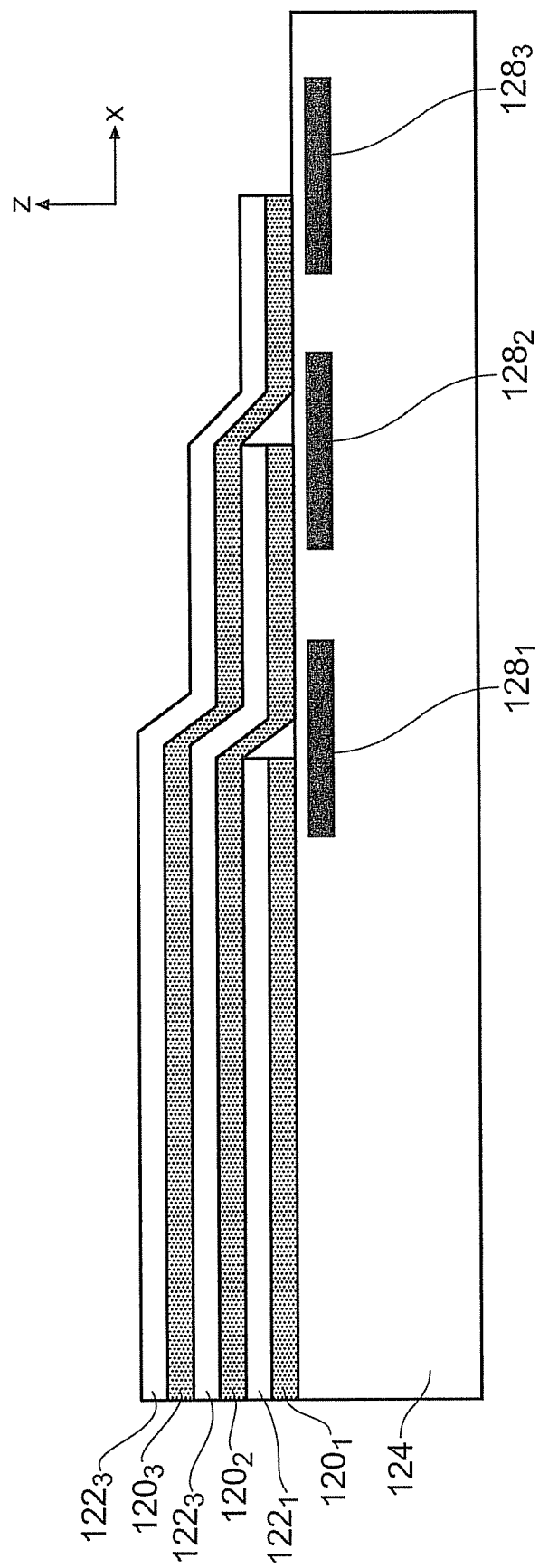
FIG. 14 is schematic side section view in the xz plane of an output side of the multi-layer memory device of FIG. 13.

FIG. 14 is schematic side section view in the xz plane of an output side of the multi-layer memory device of FIG. 13. The same nanowire layers 120 and non-magnetic layers 122 as shown in FIG. 13 are evident. As illustrated, the nanowire layers 120 and their associated non-magnetic layers 122 terminate in a staggered manner, whereby the lowest layers $120_1$ and $122_1$ terminate first, as viewed in the +x-direction. This termination causes each of the overlying pairs of layers 120 and 122 to lower or step down by the combined thickness of the terminated bottom layer. This is schematically illustrated as stepping down over a relatively limited extent in the x-direction in the form of a ramp. The layers n=2 and n=3 then extend for a further distance in the x-direction before the layers n=2 are terminated, causing the layers n=3 to step down across a further ramp. Finally the top layer (n=3 in this figure) is terminated. A terracing is thus obtained through successive termination of the lowermost pair of layers.

Underneath each end portion of the nanowire layers $120_n$, i.e. in the termination region, a magnetic detector $128_n$ is shown embedded in the substrate 124. These magnetic detectors operate in the same manner as described above for the single layer embodiment, and the same comments apply regarding the types of detector that may be employed and so forth.

Similar to the read in side of the device, it will be appreciated that this read out scheme for the stacked 3D memory elements constituted by the nanowire grid layers is implemented purely using planar, i.e. 2D, semiconductor integration methods in that the magnetic field detectors for the different nanowire layers are spaced apart in the x direction. No additional structuring in the z-direction is required in the fabrication other than the fabrication of the nanowire grid layers themselves.

The requirement to measure the field of each nanowire on the output side with its own detector may be the limiting factor in the packing density of the nanowires in the x-direction.

The standard range of data coding algorithms currently used in the hard disk industry could be used to convert the file data to physical data, thus introducing error correction. In order to reduce magnetostatic interlayer coupling and coupling between parallel nanowires in the same layer (which could reduce the thermal stability of data and hence increase the probability of data errors) it is desirable that long blocks of nanowires all with the same magnetization direction should be avoided. Assuming the physical coding suggested in this paragraph, this means that large blocks of 0's should be avoided. Symbol conversion codes such as Gray codes should be applied to the data to be stored to resolve this. Similar requirements exist in conventional hard disk drives where the detection electronics loses phase lock if there are no data transitions for extended lengths of disk. The above comments also apply to the single layer embodiment.

FIGS. 15A and 15B are schematic side section views in the xz plane showing fabrication of an input side of the multi-layer memory device.

Generally speaking, an edge portion of a shadow mask 134 is used to define the end terminations of the pairs of nanowire and non-magnetic layers 120, 122 and is advanced in increments between deposition of each pair of layers by an amount 's' in the x-direction. The advances will typically be kept constant, but in principle these could be varied from step to step if desired.

FIG. 15A shows deposition of the first pair of nanowire and non-magnetic layers $120_1$, $122_1$ in which the shadow mask edge portion 134 is in a first position. It will be appreciated that the ends of the nanowires in layer $120_1$ will not be precise ends, but rather may well have some tapering caused by penumbra shadowing or other effects at the edge of the shadow mask and as a result of the vertical separation between the substrate and the mask.

After deposition of the first pair of layers $120_1$, $122_1$, the shadow mask is advanced by a distance 's' and a second pair of layers $120_2$, $122_2$ is deposited.

FIG. 15B illustrates this deposition of the second pair of nanowire and non-magnetic layers $120_2$, $122_2$ in which the shadow mask 134 is in a second position. It will thus be understood how a succession of many pairs of layers can be formed to create multiple layers of nanowire grids with steps of width 's' in the x-direction separating each nanowire layer.

The previously described data input electrodes 126 are then fabricated, but are not shown in the present figures.

FIGS. 16A and 16B are schematic side section views in the xz plane showing fabrication of an output side of the multi-layer memory device. FIGS. 16A and 16B are comparable schematic side section views to FIGS. 15A and 15B showing the other ends of the data-carrying nanowires, namely the data output end of the memory device. These figures are in the xz plane, the same as FIGS. 15A and 15B. It will be understood that FIG. 16A is showing the same instant in time as FIG. 15A. Similarly, FIG. 16B is showing the same instant in time as FIG. 15B. At this end of the structure, a shadow mask edge portion 136 is also used which may be part of the same shadow mask as used to define the terraces on the input side, or part of an independent separate shadow mask. Like the data input side shadow mask it is advanced in increments in the +x-direction between deposition of successive pairs of layers 120, 122. The advance distance is shown as being of distance 'r' in the x-direction. This may be different for each step if desired, although it is envisaged that it will be held constant for ease of design. Moreover, the step size 'r' may be the same as 's' (e.g. if the shadow masks edge portions 134 and 136 are part of the same mask structure) or different. They can be different, since the choice of x separation of adjacent data input electrodes 126 may be independent of the choice of x separation of the magnetic detectors at the data output end. In any case, the advance distance 'r' defines the extent in the x-direction of the steps or terraces between the ramps that are created by the successive termination of the data-carrying nanowires in each layer in tam, starting from the bottom nanowire grid layer.

Figure 17A:
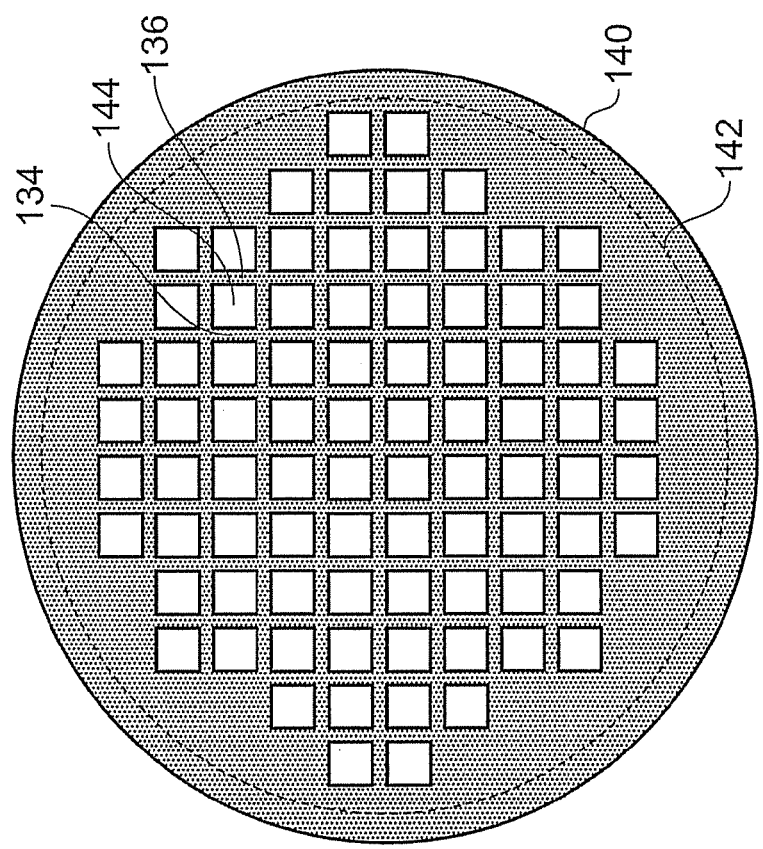
FIG. 17A is a schematic plan view in the xy plane of a shadow mask and wafer used in the fabrication process of the multi-layer memory device.

FIG. 17A is a schematic plan view in the xy plane of a shadow mask 140 and wafer 142 used in the fabrication process of the multi-layer memory device.

Figure 17B:
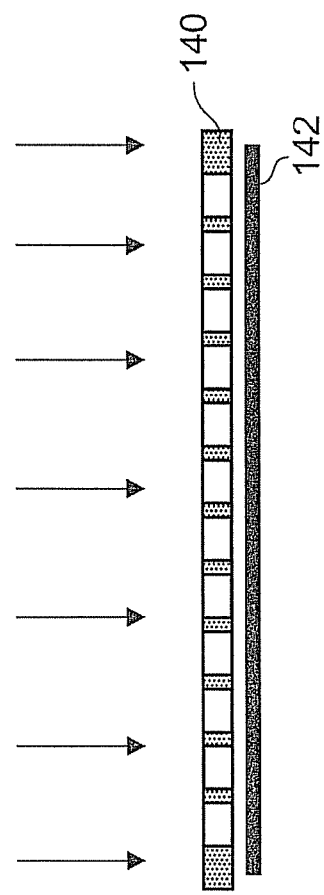
FIG. 17B is schematic side view in the xz plane of the same features as shown in FIG. 17A.

FIG. 17B is schematic side view in the xz plane of the same features as shown in FIG. 17A.

The mask 140 is generally of circular shape to match the shape of a wafer 142 of the desired diameter. The mask 140 has an array of apertures or holes 144 distributed over the mask 140 which are illustrated as being generally square, but may be rectangular or any other shape with well defined leading and trailing edge portions as viewed in the x-direction to form the mask end portions 134 and 136 respectively described further above. The apertures are illustrated highly schematically and it will be appreciated that they may each have a more complex structure to provide conventional lithography features. As described further above, the mask will be moved in stepwise fashion in the x-direction during fabrication to allow fabrication of the terraced structure of the device through deposition of material flux in the −z-direction as schematically illustrated by the downward arrows in FIG. 17B.

For fabrication, the mask will be mounted a short distance, e.g. approximately 200 microns, above the surface of the wafer and moved in the x-direction using a linear motor in vacuum during the deposition. In the simplest case there will be one set of terraces on one edge of each die for data input and another set of terraces on the other edge of each die for data output. The shadow mask can either be made by micro-machining a silicon wafer such that there are etched holes in it defined by photolithography, or by traditional mechanical machining of a thin metal plate. A given mask can be used for the production of several wafers. The lifetime limit of a mask will be determined by build-up of deposited material on the edges of the apertures in the mask, causing them to become roughened.

If it is desired to sector the serial data in such a way that the magnetic nanowires do not run across the fall width of the die, then several apertures will be needed in the shadow mask for each die, to allow a separate set of input and output terraces for each data sector. Once the terraced multilayer film has been deposited, the wafer is coated with photoresist and lines defining the magnetic nanowires exposed, developed and etched in the normal photolithography process. The photo-mask needs to define data-carrying nanowires that are long enough to completely traverse all of the steps in the terrace.

This completes the description of the main embodiments. Suitable design parameters for the circuit elements are now discussed.

Each nanowire has a length 'l', a width 'w', and a depth 'd'. The nanowire width is typically in the submicron range, such as less than 0.2 μm (200 nm), more especially a width of the order of what is achievable with conventional lithography (currently 130 nm-65 nm but ever reducing). The nanowire depth 'd' is defined by thickness of the magnetic material. Typically, the nanowires will be fabricated by some form of deposition process, such as chemical vapor deposition (CVD), physical vapor deposition (PVD), thermal evaporation or sputtering and have a thickness typically in the range 1 nm to 100 nm. The nanowire is made of a soft magnetic material such as Permalloy ($Ni_xFe_y$, where x=80±2 and y=20±2). The magnetic material may be homogenous or inhomogeneous. Homogeneous magnetic materials include ferromagnetic materials and ferrimagnetic materials. Specific examples are Permalloy, other nickel-iron alloys, a cobalt-iron alloy, or nickel-cobalt-iron alloys. Further examples are alloys containing one or more of Ni, Co and Fe optionally including one or more of Si, B, Zr, Hf, Cr, Pd, and Pt.

The nanowires will be deposited on a suitable substrate material, typically a silicon (Si) or other semiconductor substrate for integration with integrated circuit elements.

The electrodes can be made of any suitable conductors, including Au, Cu, Al, Mg, Zn, Pd, Pt or alloys of these conductors or further elements, or of degenerately doped semiconductors, or silicides.

Generally we envisage data-carrying nanowires of length up to the chip size, which may be of the order of 1 mm to 1 cm or perhaps a few cm's. The clocking nanowires could be of similar length or may be shorter.

The grid spacing is envisaged to be down to the minimum achievable with then-current state of the art lithography processing, e.g. 90 nm today, soon to be 65 nm. For example, grid spacings of down to twice the nanowire width are topographically possible, so that the grid spacing could be as low as twice the lithography limited dimension. However, grid spacings of a larger multiple of the lithographic limit are desirable, e.g. at least 3, 4, 5, 6, 7, 8, 9 or 10 times the nanowire width to provide data-carrying nanowires with perhaps 1000-100,000 crosses with the clocking nanowires, most likely between a few thousand and tens of thousands of crossing nodes. It is also noted that the nanowires need not be straight. In this respect it is known that shallow bends of less than about 30 degrees in nanowires do not create significant domain wall pinning effects. Bends thus may be incorporated, for example when this is convenient for device integration.

Magnetic simulation modeling results are now presented, which show in more detail how the "suck" and "spit" actions illustrated schematically with reference to FIGS. 4 to 7 occur.

Figure 18:
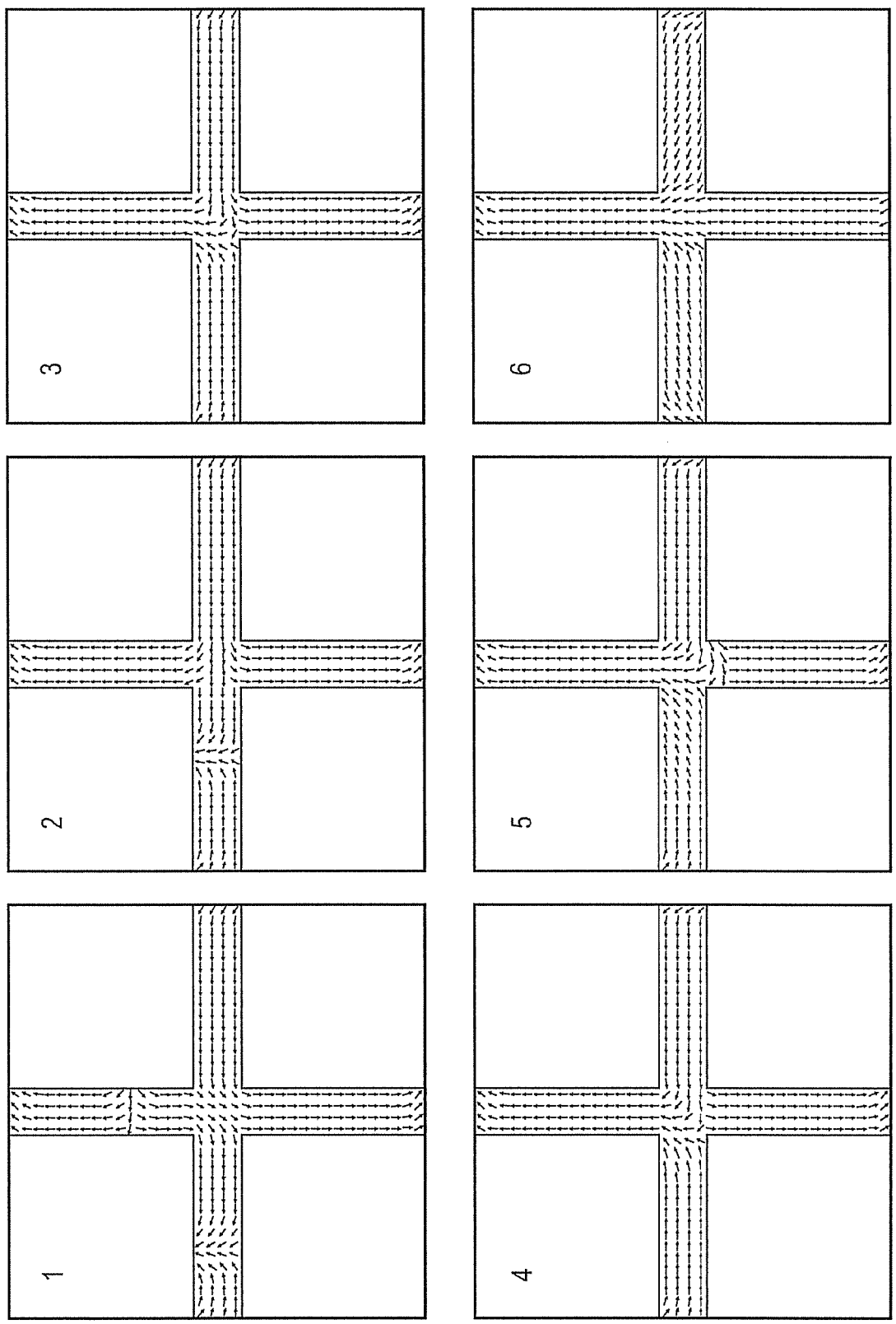
FIG. 18 shows simulation results of a head-to-head domain wall with an 'up' chirality initially in the left arm of a data nanowire being captured at a junction by a transverse domain wall of 'left' chirality passing down the clocking nanowire.

FIG. 18 shows simulation results of a head-to-head (i.e. positively charged) data domain wall with an 'up' chirality initially in the left arm of a data nanowire being captured at a junction by a tail-to-tail (i.e. negatively charged) transverse domain wall of 'left' chirality passing down the clocking nanowire. Six panels are shown of the magnetization in the cross region at six successive time intervals. In this figure a 'suck' action is shown which is similar to that shown schematically in FIGS. 5A-D except that the domain wall in the clocking nanowire passes downwards (not upwards) in the simulation. This difference is however not relevant to device action. In Panel 1, a head-to-head (data) domain wall with an 'up' chirality is visible in the left arm and a tail-to-tail (clocking) domain wall with a 'left' chirality is visible in the top arm. In Panel 2, the clocking domain wall arrives at the junction and attracts the data domain wall. In Panel 3, 4 and 5, the data domain wall remains at the junction and the clocking domain wall emerges into the bottom arm. In Panel 6, the 'suck' action is complete with the data domain wall stably pinned at the junction, and the clocking nanowire having no domain wall in the vicinity of the junction.

Figure 19:
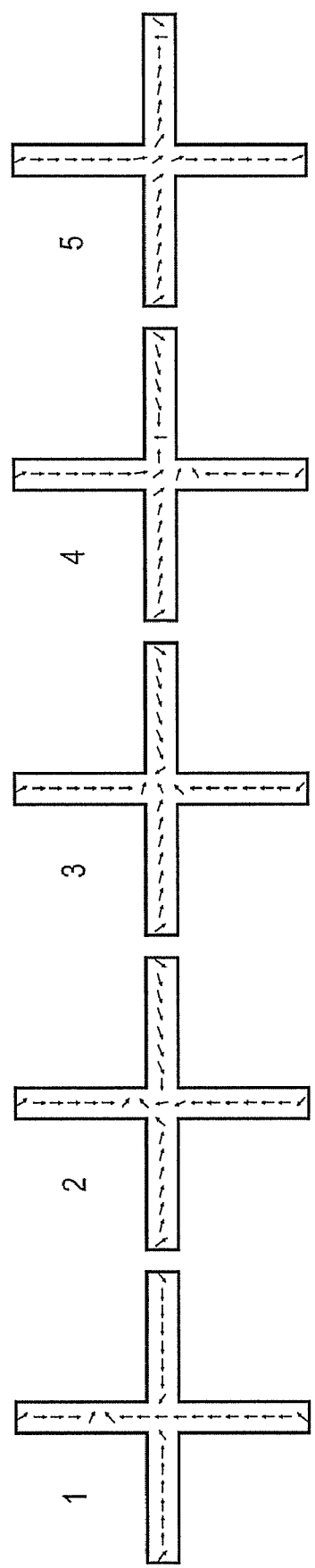
FIG. 19 shows simulation results of a head-to-head domain wall with an 'up' chirality initially captured at the junction and then being ejected from the cross by a transverse domain wall of 'right' chirality passing down the clocking nanowire.

FIG. 19 shows simulation results of a head-to-head (i.e. positively charged) data domain wall with an 'up' chirality initially captured at the junction and then ejected from the cross to the right by a head-to-head (i.e. positively charged) transverse domain wall of 'right' chirality passing down the clocking nanowire. Five panels are shown of the magnetization in the cross region at five successive time intervals In this figure a 'spit' action is shown which is similar to that shown schematically in FIGS. 5E-H except that the domain wall in the clocking nanowire passes downwards (not upwards) in the simulation. This difference is however not relevant to device action. In Panels 1 and 2, the clocking domain wall is seen moving down the top arm and approaching the junction where the data domain wall is pinned. In Panels 3 and 4, the rightward ejection of the data domain wall is visible, with the clocking domain wall emerging into the bottom arm in Panel 4. In Panel 5 the 'spit' is complete with the data domain wall visible to the right end of the right arm and the clocking domain wall disappearing off the bottom of the illustrated portion of the bottom arm.

These simulations show that for the 'suck' and 'spit' actions the charge state and chirality of the domain walls is relevant in that appropriate combinations of the charge state and chirality of the clocking and data domain walls need to be selected in order to achieve the desired 'suck' and 'spit' outcomes.

Although the embodiments above have been described in considerable detail, numerous variations and modifications will become apparent to those skilled in the art once the above disclosure is fully appreciated.

For example, the terminations of the nanowires at the data input side of the device need not be as described above, but could instead be similar to the read out structure, with the field generating electrodes being embedded in or otherwise integrated with the semiconductor substrate. To achieve this with a shadow mask fabrication process for the layer deposition, it would be preferable also to reverse the read out side fabrication, so that the read out structure would become similar to the read in structure with the magnetic detectors arranged on top of the terraces rather than below them.

Moreover the magnetic field generator need not be arranged above the magnetic nanowire structure, i.e. above the substrate. It could instead be arranged below the substrate, for example bonded to the underside of the substrate, which may be etched away to allow the magnetic field generator to be arranged closer to the nanowire array. Indeed if two magnetic field generators are desired for generating fields in the x and y directions respectively, it may be convenient if one is bonded above the substrate and the other below.

The distance that the generated magnetic field will remain homogenous in strength above a field generating chip is roughly equal to the lateral size of the chip itself. So if there is a 1 cm square field generator chip, as long as the storage layers are within approximately 1 cm of the surface of the field generator, field intensity will be maintained. In this case, it would be easy to fix the field generator underneath the storage chip. However, it is not necessary to activate all of the nanowires at a given time. Rather, the data storage can be sectored so that only the sector containing the file of interest is shifted. This allows the field generator to be segmented, so that it is not necessary to energize the entire generator, thus dramatically reducing power dissipation. However, the effective size of the generator is now reduced, and consequently the field generator chip must approach the storage chip more closely. Whether the field generator can be placed underneath the storage chip or not should be decided dependent upon how finely the sectoring has been done, and hence there is a trade-off between manufacturing precision and power dissipation.

It is intended that the following claims be interpreted to embrace all such variations and modifications as well as their equivalents.

In summary, a serial magnetic mass storage device and associated data storage method is provided based on magnetic nanowires that support single magnetic domains separated by domain walls. Each data-storing nanowire has a plurality of crossing nanowires along its length, forming cross junctions that constitute domain wall pinning sites. Data is fed through each data-storing nanowire by moving the magnetic domains under the action of a field that alternates between alignment and anti-alignment with the crossing nanowires. The data is encoded in the chirality of the domain walls, with up and down chirality transverse domain walls being used to encode 0's and 1's. Data is clocked into each nanowire with suitable nucleation generators capable of nucleating domains with domain walls of pre-defined chirality. Data is clocked out of each nanowire with suitable magnetic field sensors that sense the chirality.

REFERENCES

1. US2005/094427 "Magnetic shift register with shiftable magnetic domains between two regions, and method of using the same" Parkin
2. US2005/186686 "Method of fabricating data tracks for use in a magnetic shift register memory device" Chen and Parkin
3. US2004/251232 "Method of fabricating a shiftable magnetic shift register" Chen and Parkin
4. US2005/078509 "System and method for reading data stored on a magnetic shift register" Parkin
5. US2004/252539 "Shiftable magnetic shift register and method of using the same" Parkin
6. US2004/252538 "System and method for writing to a magnetic shift register" Parkin
7. Zhu, Allwood, Xiong, Cowburn and Gruetter: "Spatially resolved observation of domain-wall propagation in a sub-micron ferromagnetic NOT-gate" App. Phys. Letts., vol. 87 062503 (3 pages) August 2005
8. Cowburn, Allwood, Xiong and Cooke: "Domain wall injection and propagation in planar Permalloy nanowires" J. Appl. Phys., vol. 91, 10 (2002), pages 6949-6951
9. Faulkner, Cooke, Allwood, Petit, Atkinson and Cowburn: "Artificial domain wall nanotraps in $Ni_{81}Fe_{19}$ wires" J. Appl. Phys., vol. 95 (2004), pages 6717-6719
10. D. A. Allwood G. Xiong, C. C. Faulkner, D. Atkinson, D. Petit, and R. P. Cowburn, "Magnetic domain-wall logic" Science, vol. 309 (2005), pages 1688-1692
11. D. A. Allwood, Gang Xiong, M. D. Cooke, R. P. Cowburn, "Magneto-Optical Kerr Effect analysis of magnetic nanostructures" J. Phys. D 36, 2175 (2003)
12. Klaui M, Vaz C A F, Rothman J, et al. "Domain wall pinning in narrow ferromagnetic ring structures probed by magnetoresistance measurements" Phys. Rev. Letts. 90 (9): Art. No. 097202 7 Mar. 2003
13. McMichael R D, Donahue M J "Head to head domain wall structures in thin magnetic strips" IEEE Transactions on Magnetics (5): 4167-4169 Part 2 Sep. 1997
14. Porter D G and Donahue M J "Velocity of Transverse Domain Wall Motion Along Thin, Narrow Strips" J. Appl. Phys. 95, 6729 (2004)
15. Hara M, Shibata J, Imura T and Otani Y "Control of domain wall pinning by a switchable magnetic gate" Applied Physics Letters, volume 89, 192504 (2006)
16. United Kingdom Patent Application GB0609152.4

What is claimed is:

1. A magnetic memory device comprising:
a plurality of data-carrying nanowires made of magnetic material and extending in a first direction crossed by a plurality of data-clocking nanowires also made of magnetic material and extending in a second direction, collectively forming a network of cross junctions;
a data read-in part arranged adjacent to respective data read-in portions of the data-carrying nanowires and operable to nucleate magnetic domains with domain walls of pre-determined chirality in the data-carrying nanowires, wherein the chirality of the domain walls encodes the data to be stored;
a magnetic field source operable to generate a clocking field that alternates between alignment and anti-alignment with the data-clocking nanowires, which serves to move the data-carrying domain walls along the data-carrying nanowires from one cross junction to the next by successively releasing the data-carrying domain walls from the cross junctions where they are pinned and causing them to move to said next cross junction where they are pinned again; and
a data read-out part arranged adjacent to respective data read-out portions of the data-carrying nanowires and operable to sense the chirality of the domain walls in said data read-out portions.

2. The device of claim 1, comprising a further magnetic field source operable to generate an operating field aligned with the data-carrying nanowires, which serves to assist movement of the data-carrying domain walls along the data-carrying nanowires between cross junctions.

3. The device of claim 1, wherein the data read-in part comprises a plurality of nucleation field generators, one for each data-carrying nanowire, each arranged to selectively create the magnetic domains of pre-defined chirality by locally applying a field of at least the nucleation field in the data-carrying nanowire at the read-in portion.

4. The device of claim 1, wherein the data read-out part comprises a plurality of magnetic field detectors, one for each data-carrying nanowire, each arranged to sense the chirality of the domain walls in the data-carrying nanowire at the data read-out portion.

5. The device of claim 1, wherein the data-carrying nanowires are dimensioned so that domain walls that form therein are transverse domain walls, the chirality of the domain walls that encode the data thus being up or down.

6. The device of claim 1, wherein the data-clocking nanowires are dimensioned so that domain walls that form therein are transverse domain walls.

7. The device of claim 1, wherein the data-clocking nanowires are dimensioned so that domain walls that form therein are vortex domain walls.

8. The device of claim 1, further comprising a clocking domain generation part arranged adjacent to respective clocking portions of the data-clocking nanowires and operable to nucleate magnetic domains in the data-clocking nanowires.

9. The device of claim 8, wherein the clocking domain generation part is operable to nucleate domain walls of pre-determined chirality.

10. The device of claim 8, wherein the clocking domain generation part comprises a plurality of further nucleation field generators, one for each data-clocking nanowire, each arranged to selectively create the magnetic domains by locally applying a field of at least the nucleation field in the data-clocking nanowire at the clocking portion.

11. The device of claim 1, further comprising a substrate on which the network of cross junctions is arranged as a magnetic layer formed of magnetic material for the nanowires interspersed with islands of non-magnetic material to separate them.

12. The device of claim 11, further comprising additional magnetic layers, the magnetic layers being arranged on top of one another separated by non-magnetic layers.

13. The device of claim 12, wherein the pairs of magnetic and non-magnetic layers terminate in a stepwise manner on one side of the data-carrying nanowires to form terraces extending in the direction of the data-clocking nanowires.

14. The device of claim 13, wherein the magnetic layer that terminates to form each terrace is in each case the lowermost nanowire layer.

15. The device of claim 13, wherein the nanowire layer that terminates to form each terrace is in each case the uppermost nanowire layer.

16. The device of claim 12, wherein the pairs of magnetic and non-magnetic layers terminate in a stepwise manner on both sides of the data-carrying nanowires to form terraces extending in the direction of the data-clocking nanowires.

17. The device of claim 16, wherein the magnetic layer that terminates to form each terrace is the lowermost nanowire layer on one side and the uppermost nanowire layer on the other side.

18. A method of serially storing data encoded in magnetic domains in a nanowire, each magnetic domain being bounded by a domain wall, and the nanowire having a plurality of crossing nanowires along its length forming a plurality of cross junctions along the nanowire, the method comprising:

reading a stream of bits of data into the nanowire by nucleating respective magnetic domains with domain walls of pre-determined chirality at an input portion of the nanowire, wherein the chirality of the domain walls encodes the bits;

supplying a clocking field that alternates between alignment and anti-alignment with the crossing nanowires to move the domain walls, and thus the bit stream, along the nanowire from one cross junction to the next by successively releasing the domain walls from the cross junctions where they are pinned and causing them to move to said next cross junction where they are pinned again; and reading the bit stream out of the nanowire by sensing the chirality of the domain walls at an output portion of the nanowire.

* * * * *